United States Patent
Jin et al.

(10) Patent No.: US 12,439,720 B2
(45) Date of Patent: Oct. 7, 2025

(54) IMAGE SENSOR HAVING INCREASED INTEGRATION INCLUDING ACTIVE PATTERNS OVERLAPPING A PORTION OF A PIXEL ISOLATION STRUCTURE

(71) Applicant: SAMSUNG ELECTRONICS CO., LTD., Suwon-si (KR)

(72) Inventors: Younggu Jin, Osan-si (KR); Youngsun Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 478 days.

(21) Appl. No.: 17/664,863

(22) Filed: May 24, 2022

(65) Prior Publication Data

US 2022/0406825 A1    Dec. 22, 2022

(30) Foreign Application Priority Data

Jun. 22, 2021   (KR) .................. 10-2021-0080798

(51) Int. Cl.
*H10F 39/00*    (2025.01)
*H10F 39/18*    (2025.01)

(52) U.S. Cl.
CPC ........... *H10F 39/807* (2025.01); *H10F 39/18* (2025.01); *H10F 39/802* (2025.01); *H10F 39/8037* (2025.01); *H10F 39/811* (2025.01)

(58) Field of Classification Search
CPC ........... H01L 27/14603; H01L 27/1463; H01L 27/14634; H01L 27/14612;
(Continued)

(56) References Cited

U.S. PATENT DOCUMENTS

| 5,374,564 A | 12/1994 | Bruel |
| 8,378,402 B2 | 2/2013 | Moon et al. |

(Continued)

FOREIGN PATENT DOCUMENTS

| KR | 10-2016-0022087 A | 2/2016 |
| KR | 10-2018-0113726 A | 10/2018 |

(Continued)

OTHER PUBLICATIONS https://www.slideshare.net/shudhanshu29/silicon-on-insulator-soi-technology?from_action=save. "Smart Cut", Silicon on Insulator (SOI) Technology, Oct. 18, 2021, pp. 1-12.

(Continued)

*Primary Examiner* — Khiem D Nguyen
(74) *Attorney, Agent, or Firm* — Morgan, Lewis & Bockius LLP

(57) ABSTRACT

An image sensor includes a pixel isolation structure in a semiconductor substrate. The pixel isolation structure defines a plurality of pixel regions, a photoelectric conversion region in the semiconductor substrate on each of the pixel regions, a floating diffusion region in the semiconductor substrate and spaced apart from the photoelectric conversion region. A transfer gate electrode is disposed between the photoelectric conversion region and the floating diffusion region on each of the pixel regions. A dielectric layer is disposed on the semiconductor substrate and covers the transfer gate electrode. A plurality of active patterns spaced apart from each other is disposed on a top surface of the dielectric layer. A plurality of pixel transistors is disposed on corresponding active patterns. In a plan view, at least one of the active patterns overlaps a portion of the pixel isolation structure.

19 Claims, 29 Drawing Sheets

(58) Field of Classification Search
CPC ........... H01L 27/14643; H01L 27/1469; H01L 27/14609; H10F 39/18; H10F 39/802; H10F 39/8037; H10F 39/807; H10F 39/809; H10F 39/803

See application file for complete search history.

(56) References Cited

U.S. PATENT DOCUMENTS

| | | | |
|---|---|---|---|
| 8,508,013 | B2 | 8/2013 | Shim et al. |
| 8,759,137 | B2 | 6/2014 | Park |
| 8,980,671 | B2 | 3/2015 | Hongo et al. |
| 9,478,575 | B2 | 10/2016 | Kato |
| 9,609,250 | B2 | 3/2017 | Lee et al. |
| 9,627,430 | B2 | 4/2017 | Kao et al. |
| 10,573,676 | B2 | 2/2020 | Yun et al. |
| 10,854,654 | B2 * | 12/2020 | Shoyama ............ H01L 27/1463 |
| 11,063,081 | B2 | 7/2021 | Sze et al. |
| 11,211,420 | B2 * | 12/2021 | Lee .................... H01L 27/1463 |
| 11,557,616 | B2 | 1/2023 | Lee et al. |
| 2020/0035737 | A1 * | 1/2020 | Ito ..................... H01L 25/0657 |
| 2020/0168648 | A1 * | 5/2020 | Kudoh ................ H01L 27/1463 |
| 2020/0176500 | A1 * | 6/2020 | Sze ...................... H04N 25/778 |
| 2020/0185446 | A1 | 6/2020 | Endo et al. |
| 2021/0136303 | A1 * | 5/2021 | Kim .................. H01L 27/14641 |
| 2021/0143191 | A1 | 5/2021 | Ha et al. |
| 2022/0102397 | A1 * | 3/2022 | Wu ..................... H01L 27/1463 |
| 2022/0102401 | A1 * | 3/2022 | Kwag .................. H10F 39/153 |

FOREIGN PATENT DOCUMENTS

| | | |
|---|---|---|
| KR | 10-2019-0139215 A | 12/2019 |
| KR | 10-2020-0066148 A | 6/2020 |
| KR | 10-2021-0013890 A | 2/2021 |
| TW | I495041 B | 8/2015 |
| TW | I712179 B | 12/2020 |

OTHER PUBLICATIONS

Office Action dated May 22, 2025 issued in corresponding Korean Patent Application No. 10-2021-0080798.

* cited by examiner

IMAGE SENSOR HAVING INCREASED INTEGRATION INCLUDING ACTIVE PATTERNS OVERLAPPING A PORTION OF A PIXEL ISOLATION STRUCTURE

CROSS-REFERENCE TO RELATED APPLICATION

This U.S. nonprovisional application claims priority under 35 U.S.C § 119 to Korean Patent Application No. 10-2021-0080798, filed on Jun. 22, 2021 in the Korean Intellectual Property Office, the disclosure of which is hereby incorporated by reference in its entirety.

TECHNICAL FIELD

The present inventive concepts relate to an image sensor, and more particularly, to an image sensor with increased integration.

DISCUSSION OF THE RELATED ART

An image sensor converts images into electrical signals. Recent advances in computer and communication technologies have led to strong demands for high performances image sensors for use in various consumer electronic devices such as digital cameras, camcorders, PCSs (personal communication systems), game consoles, security cameras, and medical micro-cameras.

An image sensor may either be a charged coupled device (CCD) or a CMOS image sensor. The CMOS image sensor has a simple operating method, and a smaller size because its signal processing circuit is integrated into a single chip. Also, the CMOS image sensor requires relatively small power consumption, which is useful in battery-powered application. In addition, since process technology of manufacturing CMOS image sensors is compatible with CMOS process technology, the CMOS image sensors may be less expensive to produce. Accordingly, the use of the CMOS image sensors has been rapidly increasing.

SUMMARY

An image sensor includes a pixel isolation structure in a semiconductor substrate. The pixel isolation structure defines a plurality of pixel regions. A photoelectric conversion region is disposed in the semiconductor substrate on each of the plurality of pixel regions. A floating diffusion region is disposed in the semiconductor substrate and is spaced apart from the photoelectric conversion region. A transfer gate electrode is disposed between the photoelectric conversion region and the floating diffusion region on each of the plurality of pixel regions. A dielectric layer is disposed on the semiconductor substrate and covers the transfer gate electrode. Each of a plurality of active patterns is spaced apart from each other on a top surface of the dielectric layer. A plurality of pixel transistors is disposed on corresponding active patterns. At least one of the active patterns overlaps a portion of the pixel isolation structure.

An image sensor includes a photoelectric conversion circuit layer that includes a pixel isolation structure in a first semiconductor substrate. The pixel isolation structure defines a pixel region, a photoelectric conversion region in the pixel region, a floating diffusion region in the first semiconductor substrate and spaced apart from the photoelectric conversion region, and a transfer gate electrode on the first semiconductor substrate. The transfer gate electrode is disposed between the photoelectric conversion region and the floating diffusion region. A pixel circuit layer that includes an active pattern is disposed on a dielectric layer and a pixel transistor is disposed on the active pattern. The active pattern overlaps at least a portion of the pixel isolation structure. The pixel transistor is connected to the floating diffusion region. A logic circuit layer that includes a plurality of logic circuits is disposed on a second semiconductor substrate and is connected to the pixel transistor. A bottom surface of the pixel circuit layer is bonded to a top surface of the photoelectric conversion circuit layer. A top surface of the pixel circuit layer is bonded to a top surface of the logic circuit layer.

An image sensor includes a pixel isolation structure that defines first, second, third, and fourth pixel regions on a semiconductor substrate. First, second, third, and fourth photoelectric conversion regions are disposed in the semiconductor substrate and on the first, second, third, and fourth pixel regions, respectively. A floating diffusion region is disposed in the semiconductor substrate and is spaced apart from the first, second, third, and fourth photoelectric conversion regions. First, second, third, and fourth transfer gate electrodes are disposed on the first, second, third, and fourth pixel regions and are disposed between the floating diffusion region and the first, second, third, and fourth photoelectric conversion regions, respectively. Each of the first, second, third, and fourth transfer gate electrodes have a bottom surface that is at a level lower than a top surface of the semiconductor substrate. A first dielectric layer is disposed on the semiconductor substrate and covers the first, second, third, and fourth transfer gate electrodes. A second dielectric layer is bonded to a top surface of the first dielectric layer. Each of a plurality of active patterns are spaced apart from each other on the second dielectric layer. At least one of the plurality of active patterns partially overlaps the pixel isolation structure. A plurality of pixel transistors is disposed on corresponding active patterns. The pixel transistors includes a reset transistor, a dual conversion gain transistor, a source follower transistor, and a selection transistor. A plurality of first contact plugs is coupled to the pixel transistors. Each of a plurality of second contact plugs is spaced apart from the active patterns and penetrate the first and second dielectric layers. The second contact plugs are coupled to the first, second, third, and fourth transfer gate electrodes and the floating diffusion region.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

An image sensor according to some embodiments of the present inventive concepts is described below in conjunction with the accompanying drawings.

Figure 1:
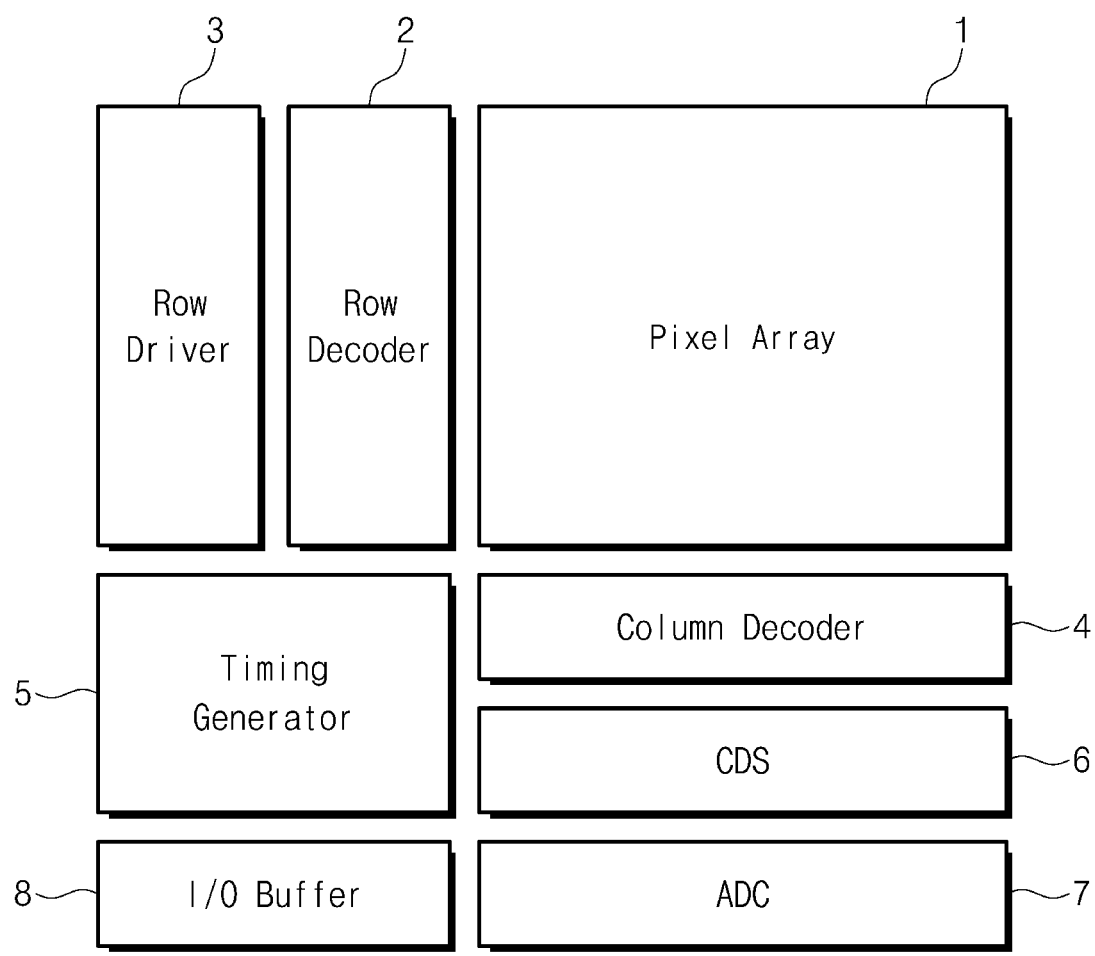
FIG. 1 illustrates a block diagram showing an image sensor according to some embodiments of the present inventive concepts.

FIG. 1 illustrates a block diagram showing an image sensor according to some embodiments of the present inventive concepts.

Referring to FIG. 1, an image sensor may include a pixel array 1, a row decoder 2, a row driver 3, a column decoder 4, a timing generator 5, a correlated double sampler (CDS) 6, an analog-to-digital converter (ADC) 7, and an input/output (I/O) buffer 8.

The pixel array 1 may include a plurality of unit pixels arranged along rows and columns. and the pixel array 1 may convert light incident on the unit pixels into electrical signals. The pixel array 1 may be driven by a plurality of drive signals such as a selection signal, a reset signal, and a transfer signal that are provided from the row decoder 2.

The row decoder 2 may provide several drive signals to each row of the unit pixels. The correlated double sampler 6 may be provided with electrical signals converted in the pixel array 1 in response to the drive signals.

The row driver 3 may provide the pixel array 1 with several drive signals for driving several unit pixels in accordance with a decoded result obtained from the row decoder 2. When the unit pixels are arranged in a matrix shape, the drive signals may be provided to each row of the unit pixels.

The timing generator 5 may control the row decoder 2, the column decoder 4, the correlated double sampler 6, the analog-to-digital converter 7, and the input/output buffer 8, which are supplied by the timing generator 5, with control signals such as a clock signal, a timing control signal, and/or other signals. The timing generator 5 may include a logic control circuit, a phase lock loop (PLL) circuit, a timing control circuit, a communication interface circuit, and/or other circuits.

The correlated double sampler 6 may receive the electrical signals generated in the pixel array 1 and may hold and sample the received electrical signals. The correlated double sampler 6 may perform a double sampling operation to sample a specific noise level and a signal level of the electrical signal, and then output a difference level corresponding to a difference between the noise and signal levels.

The analog-to-digital converter (ADC) 7 may convert analog signals, which correspond to the difference level received from the correlated double sampler 6, into digital signals, and then may output the converted digital signals.

The input/output buffer 8 may latch the digital signals and then sequentially output the latched digital signals to an image signal processing unit in response to the decoded result obtained from the column decoder 4.

Figure 2A:
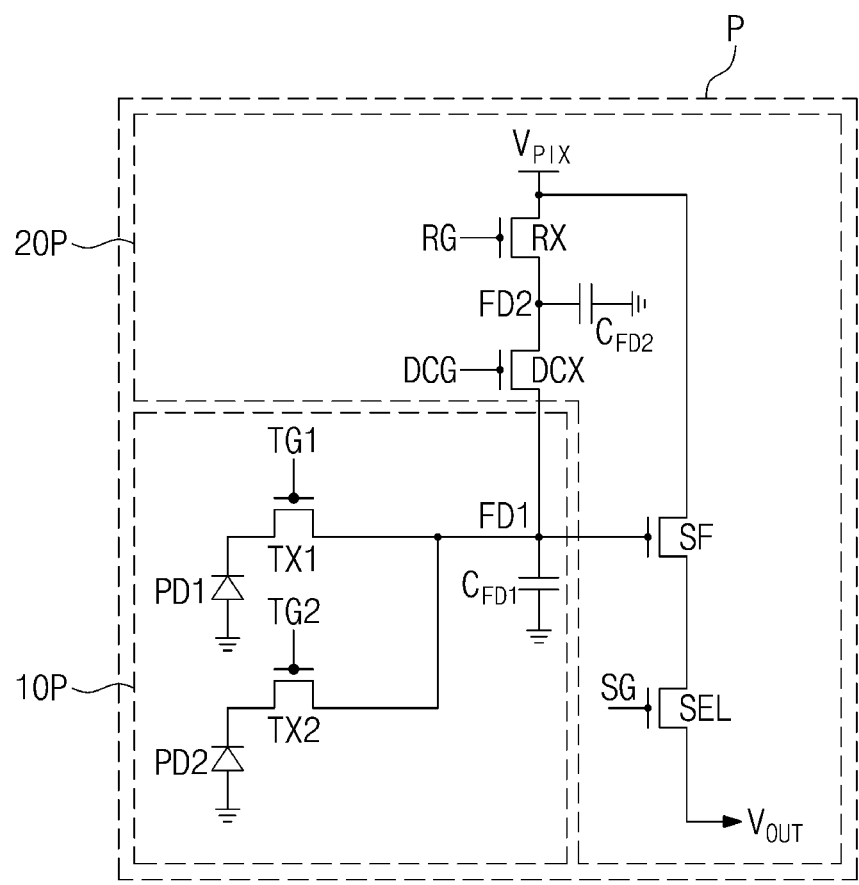
FIGS. 2A, 2B, and 2C illustrate circuit diagrams showing a unit pixel of a pixel array according to some embodiments of the present inventive concepts.
Figure 2B:
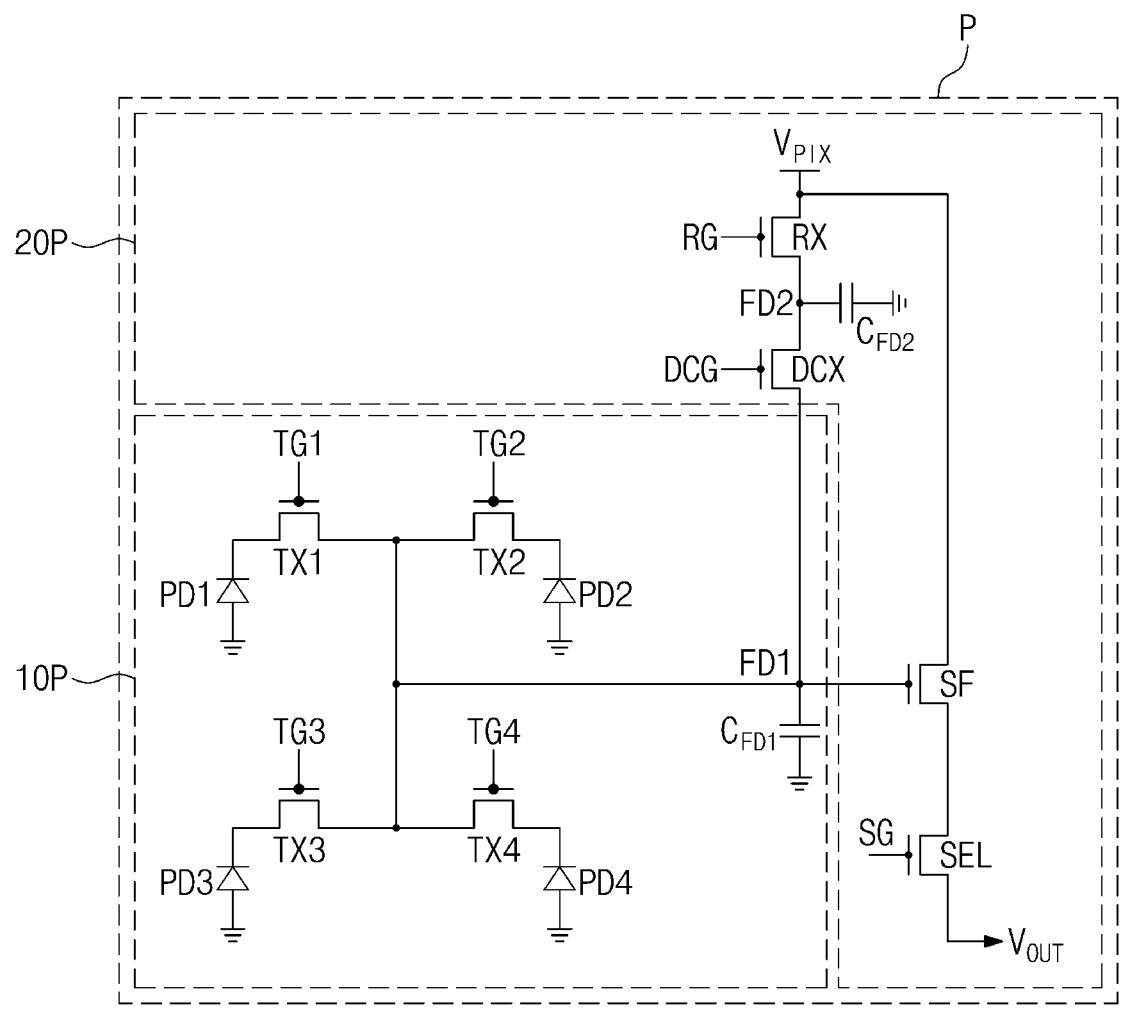
Figure 2C:
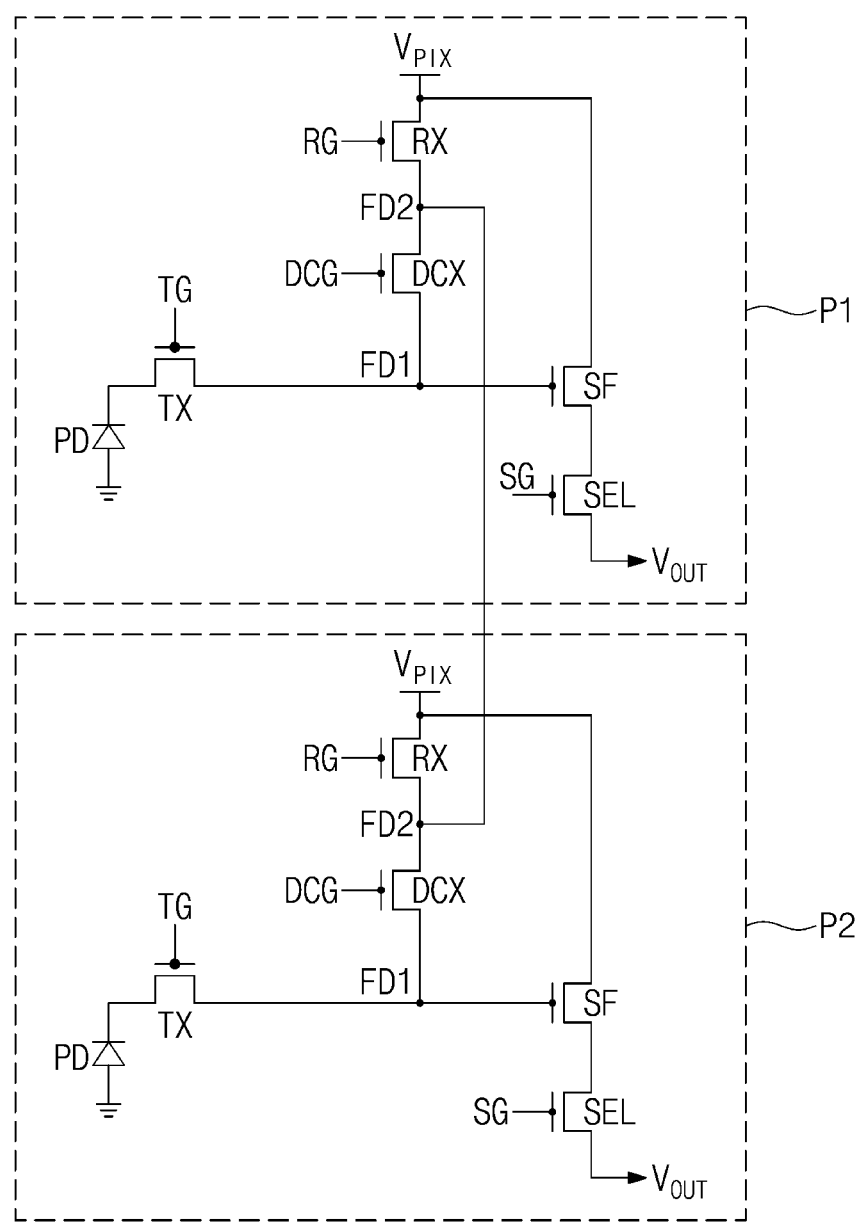

FIGS. 2A, 2B, and 2C illustrate circuit diagrams showing a unit pixel of a pixel array according to some embodiments of the present inventive concepts.

Referring to FIG. 2A, a unit pixel P may include a photoelectric conversion circuit 10P and a pixel circuit 20P.

The photoelectric conversion circuit 10P may include a plurality of photoelectric conversion elements, a plurality of transfer transistors, and a floating diffusion region FD. For example, the photoelectric conversion circuit 10P may include first and second photoelectric conversion elements PD1 and PD2, first and second transfer transistors TX1 and TX2, and a first floating diffusion region FD1 connected in common to the first and second transfer transistors TX1 and TX2.

The pixel circuit 20P may include a reset transistor RX, a source follower transistor SF, a selection transistor SEL, and a dual conversion gain transistor DCX. The pixel circuit 20P may further include a second floating diffusion region FD2 connected in common to the reset transistor RX and the dual conversion gain transistor DCX. In some embodiments, it is depicted that each unit pixel P includes four pixel transistors (see PTR of FIG. 3), but the present inventive concepts are not necessarily limited thereto, and any number of pixel transistors PTR may be disposed within each unit pixel P.

For example, the first and second photoelectric conversion elements PD1 and PD2 may generate and accumulate charge in proportion to an amount of externally incident light. The first and second photoelectric conversion elements PD1 and PD2 may each be one of a photo diode, a photo transistor, a photo gate, a pinned photo diode (PPD), and any combination thereof.

The first and second transfer transistors TX1 and TX2 may provide the first floating diffusion region FD1 with the charge accumulated in the first and second photoelectric conversion elements PD1 and PD2. The first and second transfer transistors TX1 and TX2 may be controlled with first and second transfer signals TG1 and TG2. The first and second transfer transistors TX1 and TX2 may share the first floating diffusion region FD1.

The first floating diffusion region FD1 may receive and accumulate charge generated from the first photoelectric conversion element PD1 or the second photoelectric conversion element PD2. The source follower transistor SF may be controlled in accordance with an amount of photo-charge accumulated in the first floating diffusion region FD1.

In response to a reset signal RG applied to a reset gate electrode, the reset transistor RX may periodically reset the charge accumulated in the first floating diffusion region FD1 and the second floating diffusion region FD2. For example, the reset transistor RX may have a drain terminal connected to the dual conversion gain transistor DCX and may also have a source terminal connected to a pixel power voltage $V_{PIX}$. When the reset transistor RX and the dual conversion gain transistor DCX are turned on, the pixel power voltage $V_{PIX}$ may be delivered to the first and second floating diffusion regions FD1 and FD2. Therefore, the charge accumulated in the first and second floating diffusion regions FD1 and FD2 may be discharged to reset the first and second floating diffusion regions FD1 and FD2.

The dual conversion gain transistor DCX may be connected between the first floating diffusion region FD1 and the second floating diffusion region FD2. The dual conversion gain transistor DCX may be connected in series to the reset transistor RX through the second floating diffusion region FD2. For example, the dual conversion gain transistor DCX may be connected between the first floating diffusion region FD1 and the reset transistor RX. In response to a dual conversion gain control signal, the dual conversion gain transistor DCX may change a capacitance (e.g., $C_{FD1}$) of the first floating diffusion region FD1, thereby changing a conversion gain of the unit pixel P.

For example, when an image is captured, light with low illuminance and light with high illuminance may be simultaneously incident onto a pixel array, or light with high intensity and light with low intensity may be concurrently incident onto a pixel array. Therefore, a conversion gain of each pixel may be variable in accordance with incident light. For example, when the dual conversion gain transistor DCX is turned off, the unit pixel P may have a first conversion gain, and when the dual conversion gain transistor DCX is turned on, the unit pixel P may have a second conversion gain that is greater than the first conversion gain. Thus, according to an operation of the dual conversion gain transistor DCX, different conversion gains may be provided in a first conversion gain mode (or high illumination mode) and a second conversion gain mode (or low illumination mode).

When the dual conversion gain transistor DCX is turned off, a capacitance of the first floating diffusion region FD1 may correspond to a first capacitance $C_{FD1}$. When the dual conversion gain transistor DCX is turned on, the first floating diffusion region FD1 and the second floating diffusion region FD2 may be connected and thus a capacitance of the first and second floating diffusion regions FD1 and FD2 may correspond to a sum of first and second capacitances $C_{FD1}$ and $C_{FD2}$. For example, when the dual conversion gain transistor DCX is turned on, a capacitance of the first floating diffusion region FD1 or the second floating diffusion region FD2 may be increased to reduce a conversion gain, and when the dual conversion gain transistor DCX is turned off, a capacitance of the first floating diffusion region FD1 may be reduced to increase a conversion gain.

The source follower transistor SF may be a source follower buffer amplifier that generates a source-drain current in proportion to an amount of charge applied to a source follower gate electrode from the first floating diffusion region FD1. The source follower transistor SF may amplify a variation in electrical potential of the first floating diffusion region FD1 and may output the amplified signal to an output line $V_{OUT}$ through the selection transistor SEL. The source follower transistor SF may have a source terminal connected to the pixel power voltage $V_{PIX}$ and a drain terminal connected to a source terminal of the selection transistor SEL.

The selection transistor SEL may select each row of the unit pixel P to be readout. When the selection transistor SEL is turned on in response to a selection signal SG applied to a selection gate electrode, the output line $V_{OUT}$ may output an electrical signal that is output from the drain terminal of the source follower transistor SF.

Referring to FIG. 2B, as discussed with reference to FIG. 2A, the unit pixel P may include a photoelectric conversion circuit 10P and a pixel circuit 20P, and the photoelectric conversion circuit 10P may include first, second, third, and fourth photoelectric conversion elements PD1, PD2, PD3, and PD4, first, second, third, and fourth transfer transistors TX1, TX2, TX3, and TX4, and a first floating diffusion region FD1. Likewise, the embodiment of FIG. 2A, the pixel circuit 20P may include four pixel transistors RX, DCX, SF, and SEL.

The first, second, third, and fourth transfer transistors TX1, TX2, TX3, and TX4 may share the first floating diffusion region FD1. The first, second, third, and fourth transfer transistors TX1, TX2, TX3, and TX4 may have respective first, second, third, and fourth transfer gate electrodes that are respectively controlled with first, second, third, and fourth transfer signals TG1, TG2, TG3, and TG4.

Referring to FIG. 2C, a pixel array may include first and second pixels P1 and P2, and each of the first and second pixels P1 and P2 may include a photoelectric conversion element PD, a transfer transistor TX, a reset transistor RX, a dual conversion gain transistor DCX, a source follower transistor SF, and a selection transistor SEL. Each of the first and second pixels P1 and P2 may further include a first floating diffusion region FD1 and a second floating diffusion region FD2.

On each of the first and second pixels P1 and P2, as discussed above with reference to FIG. 2A, the dual conversion gain transistor DCX may be connected between the first floating diffusion region FD1 and the second floating diffusion region FD2. The second floating diffusion regions FD2 of the first and second pixels P1 and P2 may be connected to each other.

Figure 3:
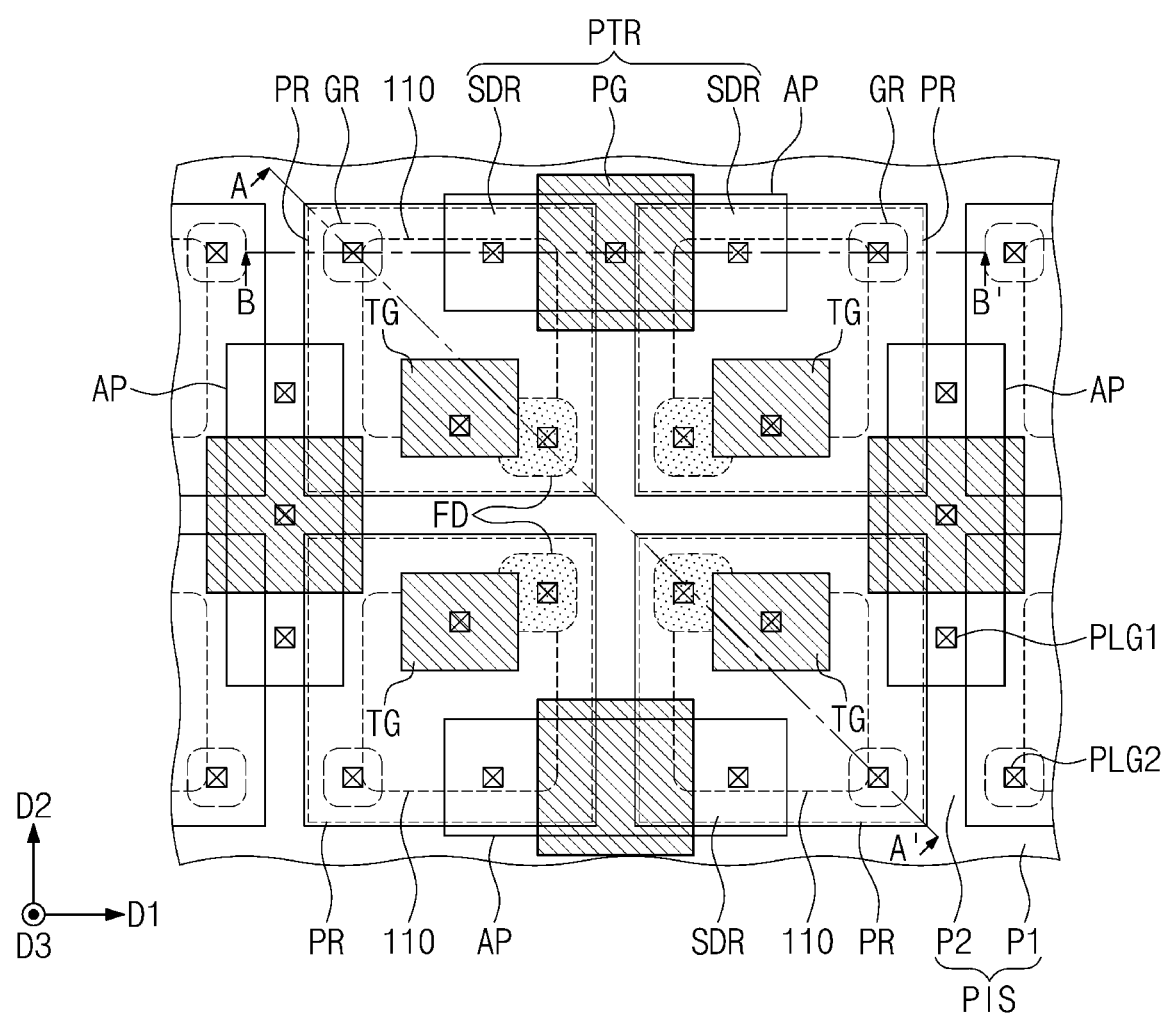
FIG. 3 illustrates a plan view showing a unit pixel of an image sensor according to some embodiments of the present inventive concepts.
Figure 4A:
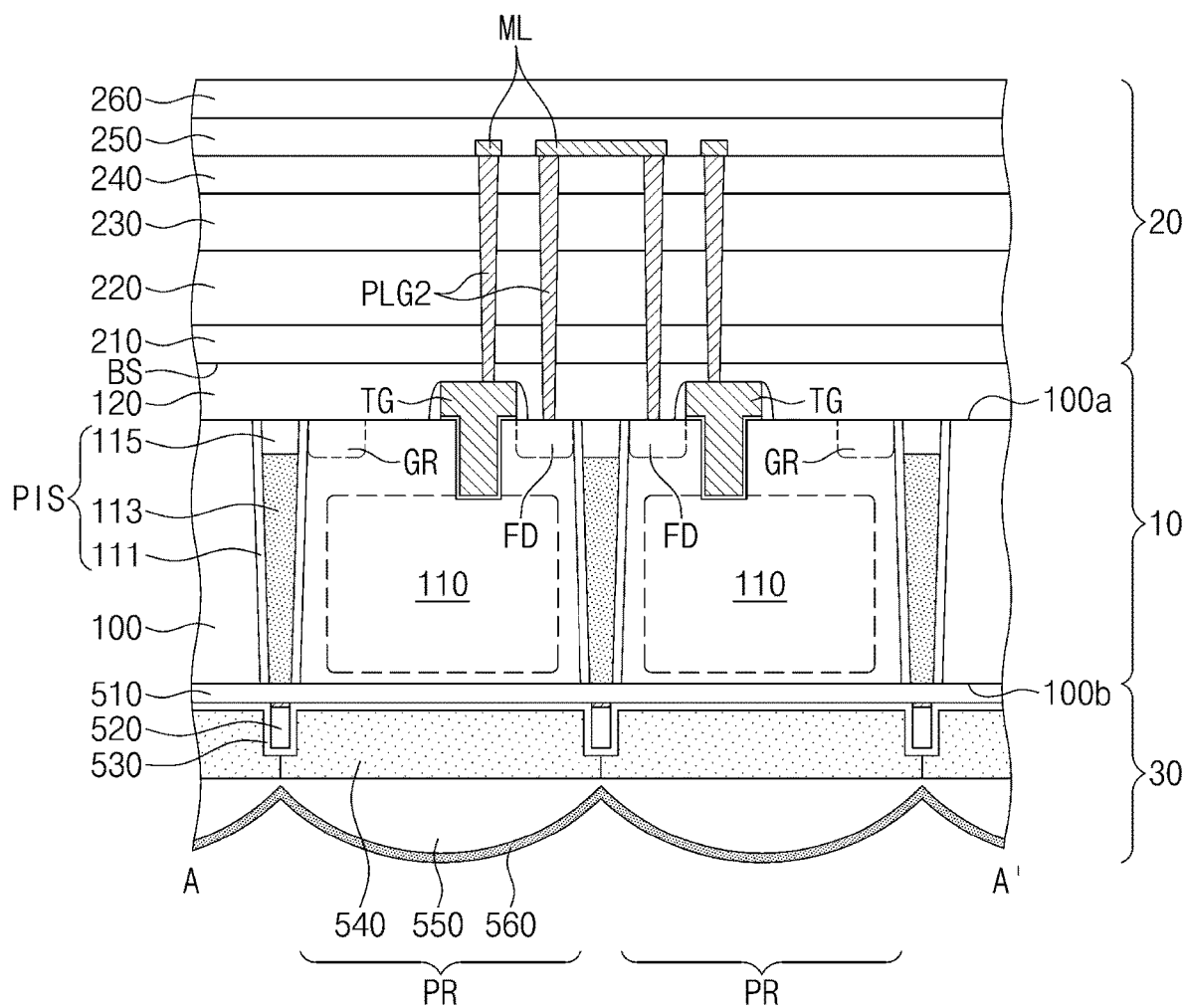
FIGS. 4A and 4B illustrate cross-sectional views respectively taken along lines A-A' and B-B' of FIG. 3, showing an image sensor according to some embodiments of the present inventive concepts.
Figure 4B:
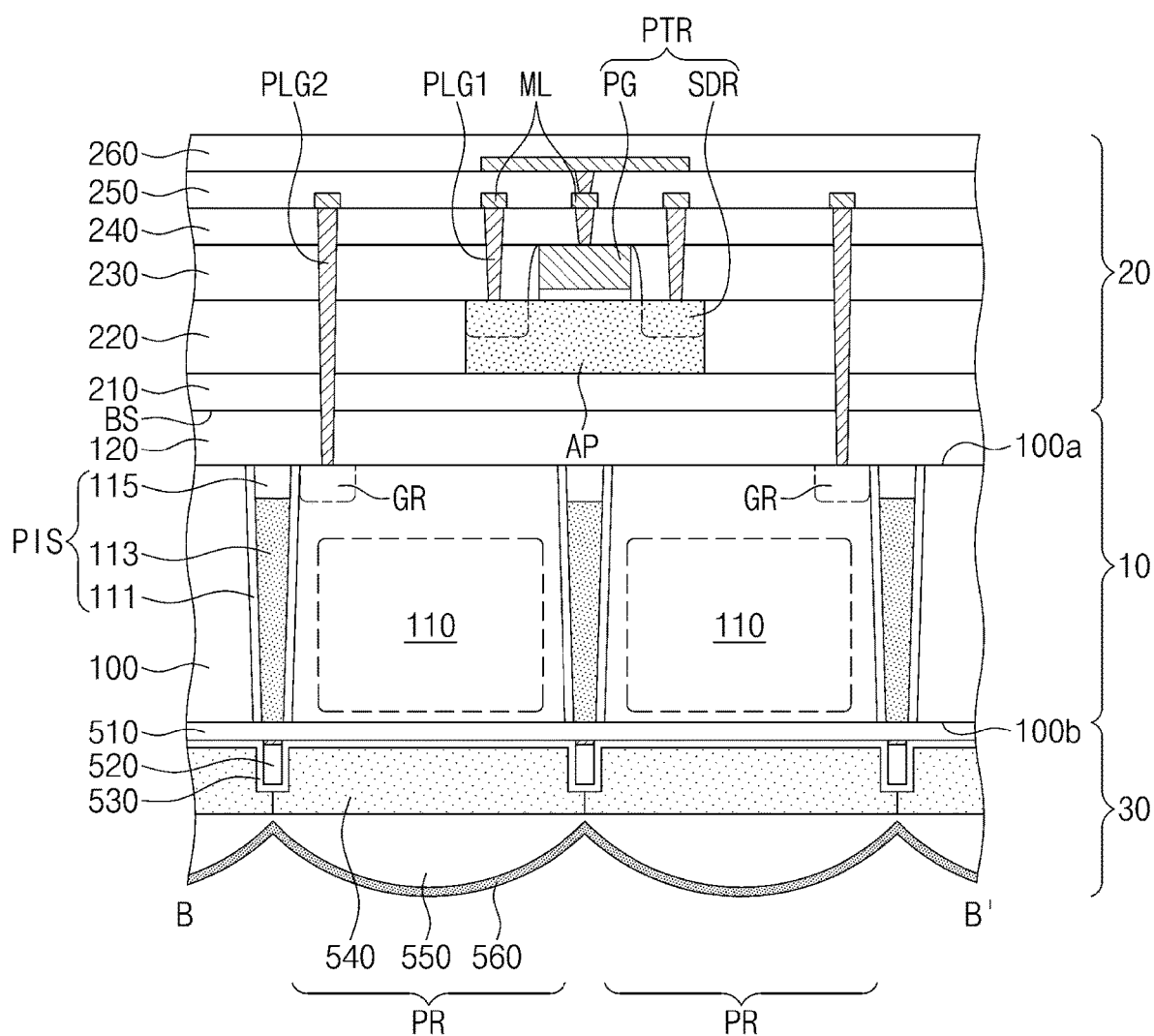

FIG. 3 illustrates a plan view showing a unit pixel of an image sensor according to some embodiments of the present inventive concepts. FIGS. 4A and 4B illustrate cross-sectional views respectively taken along lines A-A' and B-B' of FIG. 3, showing an image sensor according to some embodiments of the present inventive concepts.

Referring to FIGS. 3, 4A, and 4B, an image sensor, according to some embodiments of the present inventive concepts, may include a photoelectric conversion circuit layer 10, a pixel circuit layer 20, and an optical transmission layer 30.

When viewed in vertical cross-section, the photoelectric conversion circuit layer 10 may be interposed between the pixel circuit layer 20 and the optical transmission layer 30. The photoelectric conversion circuit layer 10 may include a first semiconductor substrate 100, a pixel isolation structure PIS, a photoelectric conversion region 110, a transfer gate electrode TG, a floating diffusion region FD, and a first dielectric layer 120.

The first semiconductor substrate 100 may have a first surface (or a front surface) 100a and a second surface (or a rear surface) 100b that are opposite to each other. The first semiconductor substrate 100 may be an epitaxial layer formed on a bulk silicon substrate that has the same first conductivity type (e.g., p-type) as that of the epitaxial layer, or a p-type epitaxial layer from which a bulk silicon substrate is removed in fabrication of the image sensor. Alternatively, the first semiconductor substrate 100 may be a bulk semiconductor substrate that includes a well of the first conductivity type.

The pixel isolation structure PIS may be disposed on the first semiconductor substrate 100. The pixel isolation structure PIS may define pixel regions PR on the first semiconductor substrate 100. The pixel regions PR may be arranged in a matrix shape along a first direction D1 and a second direction D2.

The pixel isolation structure PIS may include first parts P1 that extend parallel to each other along the first direction D1 and may also include second parts P2 that extend parallel to each other along the second direction D2 while running in the second direction D2 across the first parts P1. In a plan view, the pixel isolation structure PIS may at least partially surround each of the pixel regions PR.

The pixel isolation structure PIS may extend from the first surface 100a toward the second surface 100b. The pixel isolation structure PIS may have an upper width at the first surface 100a of the first semiconductor substrate 100 and a lower width at the second surface 100b of the first semiconductor substrate 100. The lower width may be substantially the same as or less than the upper width. The pixel isolation structure PIS may have a width that gradually decreases in a direction away from the first surface 100a toward the second surface 100b of the first semiconductor substrate 100. In contrast, the pixel isolation structure PIS may have a width that progressively increases in a direction away from the first surface 100a toward the second surface 100b of the first semiconductor substrate 100.

The pixel isolation structure PIS may include a liner dielectric pattern 111, a semiconductor pattern 113, and a capping dielectric pattern 115. The semiconductor pattern 113 may vertically penetrate a portion of the first semiconductor substrate 100, and the liner dielectric pattern 111 may be disposed between the semiconductor pattern 113 and the first semiconductor substrate 100. The capping dielectric pattern 115 may be disposed on the semiconductor pattern 113 and may have a top surface at substantially the same level as that of the first surface 100a of the first semiconductor substrate 100. The liner dielectric pattern 111 and the capping dielectric pattern 115 may include a silicon oxide layer, a silicon oxynitride layer, and/or a silicon nitride layer. The semiconductor pattern 113 may include an undoped polysilicon layer or an impurity-doped polysilicon layer. The semiconductor pattern 113 may have an air gap or a void.

On each pixel region PR, the photoelectric conversion region 110 may be disposed in the first semiconductor substrate 100. The photoelectric conversion region 110 may generate photo-charge in proportion to intensity of incident light. The photoelectric conversion region 110 may be formed by implanting the first semiconductor substrate 100 with impurities having a second conductivity type opposite to the first conductivity type of the first semiconductor substrate 100. A photodiode may be formed at a junction between the first semiconductor substrate 100 of the first conductivity type and the photoelectric conversion region 110 of the second conductivity type.

On each pixel region PR, the transfer gate electrode TG may be disposed in the first semiconductor substrate 100.

In a plan view, the transfer gate electrode TG may partially overlap the photoelectric conversion region 110. The transfer gate electrode TG may include a lower part that is inserted into the first semiconductor substrate 100 and may also include an upper part that is connected to the lower part and protrudes above the first surface 100a of the first semiconductor substrate 100. The lower part of the transfer gate electrode TG may vertically penetrate a portion of the first semiconductor substrate 100. The transfer gate electrode TG may have a bottom surface located at a lower level than that of the first surface 100a of the first semiconductor substrate 100. A gate dielectric layer may be interposed between the transfer gate electrode TG and the first semiconductor substrate 100.

On each pixel region PR, the floating diffusion region FD may be disposed in the first semiconductor substrate 100 on one side of the transfer gate electrode TG. The floating diffusion region FD may vertically overlap a portion of the photoelectric conversion region 110. The floating diffusion region FD may be formed by implanting the first semiconductor substrate 100 with impurities whose conductivity type is opposite to that of first semiconductor substrate 100. For example, the floating diffusion region FD may be an n-type impurity region.

On each pixel region PR, the first semiconductor substrate 100 may be disposed therein with a ground impurity region GR spaced apart from the transfer gate electrode TG. The ground impurity region GR may vertically overlap a portion of the photoelectric conversion region 110. The ground impurity region GR may be formed by doping impurities having the first conductivity type the same as that of the first semiconductor substrate 100. For example, the ground impurity region GR may be a p-type impurity region.

The first semiconductor substrate 100 may be disposed on its first surface 100a with the first dielectric layer 120 that covers the transfer gate electrode TG. The first dielectric layer 120 may have a top surface that is substantially flat. The first dielectric layer 120 may include, for example, silicon oxide, silicon nitride, and/or silicon oxynitride.

According to some embodiments, the pixel circuit layer 20 may be disposed on the first dielectric layer 120 of the photoelectric conversion circuit layer 10.

The pixel circuit layer 20 may include pixel transistors PTR that read electrical signals that are converted in unit pixels (see P of FIG. 2A or 2B) and drive circuits (e.g., row driver, column driver, timing controller, and other circuits) for driving a pixel array.

The pixel circuit layer 20 may include a second dielectric layer 210, active patterns AP on the second dielectric layer 210, and the pixel transistors PTR on corresponding active patterns AP.

The second dielectric layer 210 and the first dielectric layer 120 may be bonded to each other to constitute a bonding surface BS. For example, a bottom surface of the second dielectric layer 210 may be bonded to an entire top surface of the first dielectric layer 120 included in the photoelectric conversion circuit layer 10. The second dielectric layer 210 may include, for example, silicon oxide, silicon nitride, and/or silicon oxynitride.

The active patterns AP may be spaced apart from each other on the second dielectric layer 210. The active patterns AP may each have a bar shape on the second dielectric layer 210. Each of the active patterns AP may have, on the second dielectric layer 210, a major axis in the first direction D1 or in the second direction D2 orthogonal to the first direction D1. The active patterns AP may include a semiconductor material, such as silicon, germanium, or silicon-germanium.

In a plan view, each of the active patterns AP may partially overlap at least one of the photoelectric conversion regions 110. In a plan view, each of the active patterns AP may overlap a portion of the pixel isolation structure PIS. It is depicted that the active patterns AP do not overlap the transfer gate electrodes TG, but the present inventive concepts are not necessarily limited thereto, and one of the active patterns AP may partially overlap at least one of the transfer gate electrodes TG. Each of the active patterns AP may include source/drain regions SDR and a channel region between the source/drain regions SDR.

A buried dielectric layer 220 may fill a space between the active patterns AP. The buried dielectric layer 220 may have a top surface substantially coplanar with those of the active patterns AP. The buried dielectric layer 220 may include, for example, silicon oxide, silicon nitride, and/or silicon oxynitride.

The pixel transistors PTR may be correspondingly disposed on the active patterns AP. The pixel transistors PTR may include a reset transistor (see RX of FIG. 2A or 2B), a source follower transistor (see SF of FIG. 2A or 2B), a dual conversion gain transistor (see DCX of FIG. 2A or 2B), and a selection transistor (see SEL of FIG. 2A or 2B).

For example, on the second dielectric layer 210, four pixel transistors PTR may be disposed to correspond to four pixel regions PR. Alternatively, four pixel transistors PTR may be disposed to correspond to six, eight, or nine pixel regions PR.

For example, each of the pixel transistors PTR may overlap two pixel regions PR. For an example, each of the pixel transistors PTR may overlap four pixel regions PR.

Each of the pixel transistors PTR may include a pixel gate electrode PG that runs across the active pattern AP and source/drain regions SDR that is disposed in the active pattern AP on opposite sides of the pixel gate electrode PG.

The pixel gate electrode PG may have a bottom surface that is parallel to the top surface of the active pattern AP. The pixel gate electrode PG may include, for example, doped polysilicon, metal, conductive metal nitride, conductive metal silicide, conductive metal oxide, or any combination thereof.

A gate dielectric layer may be disposed between the pixel gate electrodes PG and the active patterns AP. The gate dielectric layer may be formed of a silicon oxide layer, a silicon oxynitride layer, a high-k dielectric layer (e.g., a layer including a material whose dielectric constant is greater than that of a silicon oxide layer), or any combination thereof.

The source/drain regions SDR may include impurities having the second conductivity type. For example, the source/drain regions SDR may include n-type impurities.

The buried dielectric layer 220 may be disposed thereon with interlayer dielectric layers 230, 240, 250, and 260 that cover the pixel transistors PTR.

First contact plugs PLG1 may penetrate the interlayer dielectric layers 230 and 240, thereby being coupled to the pixel gate electrodes PG and the source/drain regions SDR. The first contact plugs PLG1 may include metal, such as tungsten, copper, aluminum, or any alloy thereof.

Second contact plugs PLG2 may penetrate the interlayer dielectric layers 230 and 240, the buried dielectric layer 220, the second dielectric layer 210, and the first dielectric layer 120, thereby being coupled to the transfer gate electrodes TG, the floating diffusion regions FD, and the ground impurity regions GR. The second contact plugs PLG2 may be laterally spaced apart from the active patterns AP. The second contact plugs PLG2 may have their lengths different from those of the first contact plugs PLG1, and the first and second contact plugs PLG1 and PLG2 may have their top surfaces that are substantially coplanar with each other. The second contact plugs PLG2 may include the same metal as that of the first contact plugs PLG1.

The interlayer dielectric layers 240 and 250 may be disposed thereon with conductive lines ML coupled to the first and second contact plugs PLG1 and PLG2. The conductive lines ML may include metal, such as tungsten, copper, aluminum, or any alloy thereof.

The pixel transistors PTR of the pixel circuit layer 20 may be electrically connected to the floating diffusion region FD of the photoelectric conversion circuit layer 10 through the first and second contact plugs PLG1 and PLG2 and the conductive lines ML.

According to some embodiments, the optical transmission layer 30 may be disposed on the second surface 100b of the first semiconductor substrate 100. The optical transmission layer 30 may include a planarized dielectric layer 510, a grid structure 520, a protection layer 530, color filters 540, micro-lenses 550, and a passivation layer 560. The optical transmission layer 30 may focus and filter externally incident light, and the photoelectric conversion circuit layer 10 may be provided with the focused and filtered light.

For example, the planarized dielectric layer 510 may cover the second surface 100b of the first semiconductor substrate 100. The planarized dielectric layer 510 may be formed of a transparent dielectric material and may include a plurality of layers. The planarized dielectric layer 510 may be formed of a dielectric material whose refractive index is different from that of the first semiconductor substrate 100. The planarized dielectric layer 510 may include metal oxide and/or silicon oxide.

The grid structure 520 may be disposed on the planarized dielectric layer 510. Similar to the pixel isolation structure PIS, the grid structure 520 may have a grid or mesh shape in a plan view. In a plan view, the grid structure 520 may overlap the pixel isolation structure PIS. For example, the grid structure 520 may include first parts that extend in the first direction D1 and may also include second parts that extend in the second direction D2 while running across the first parts. The grid structure 520 may have a width substantially the same as or less than a minimum width of the pixel isolation structure PIS.

The grid structure 520 may include a conductive pattern and/or a low-refractive pattern. The conductive pattern may include a metallic material, such as titanium, tantalum, or tungsten. The low-refractive pattern may be formed of a material whose refractive index is less than that of the conductive pattern. The low-refractive pattern may be formed of an organic material and may have a refractive index of about 1.1 to about 1.3. For example, the grid structure 520 may be a polymer layer including silica nano-particles.

The planarized dielectric layer 510 may be disposed thereon with the protection layer 530 having a substantially uniform thickness that covers a surface of the grid structure 520. The protection layer 530 may be a single or multiple layer including, for example, an aluminum oxide layer and/or a silicon carbon oxide layer.

The color filters 540 may be formed to correspond to the pixel regions PR. The color filters 540 may fill spaces defined by the grid structure 520. Based on a unit pixel, the color filter 540 may include one of red, green, and blue color filters or one of magenta, cyan, and yellow color filters.

The micro-lenses 550 may be disposed on the color filters 540. The micro-lenses 550 may each have a convex shape with a certain radius of curvature. The micro-lenses 550 may be formed of a light-transmitting resin.

The passivation layer 560 may conformally cover surfaces of the micro-lenses 550. The passivation layer 560 may be formed of, for example, inorganic oxide.

The following will discuss image sensors according to some embodiments of the present inventive concepts, and to the extent that a detailed explanation of various technical features are omitted below, it is to be assumed that these features are at least similar to corresponding features that have been described above with reference to FIGS. 3, 4A, and 4B.

Figure 5:
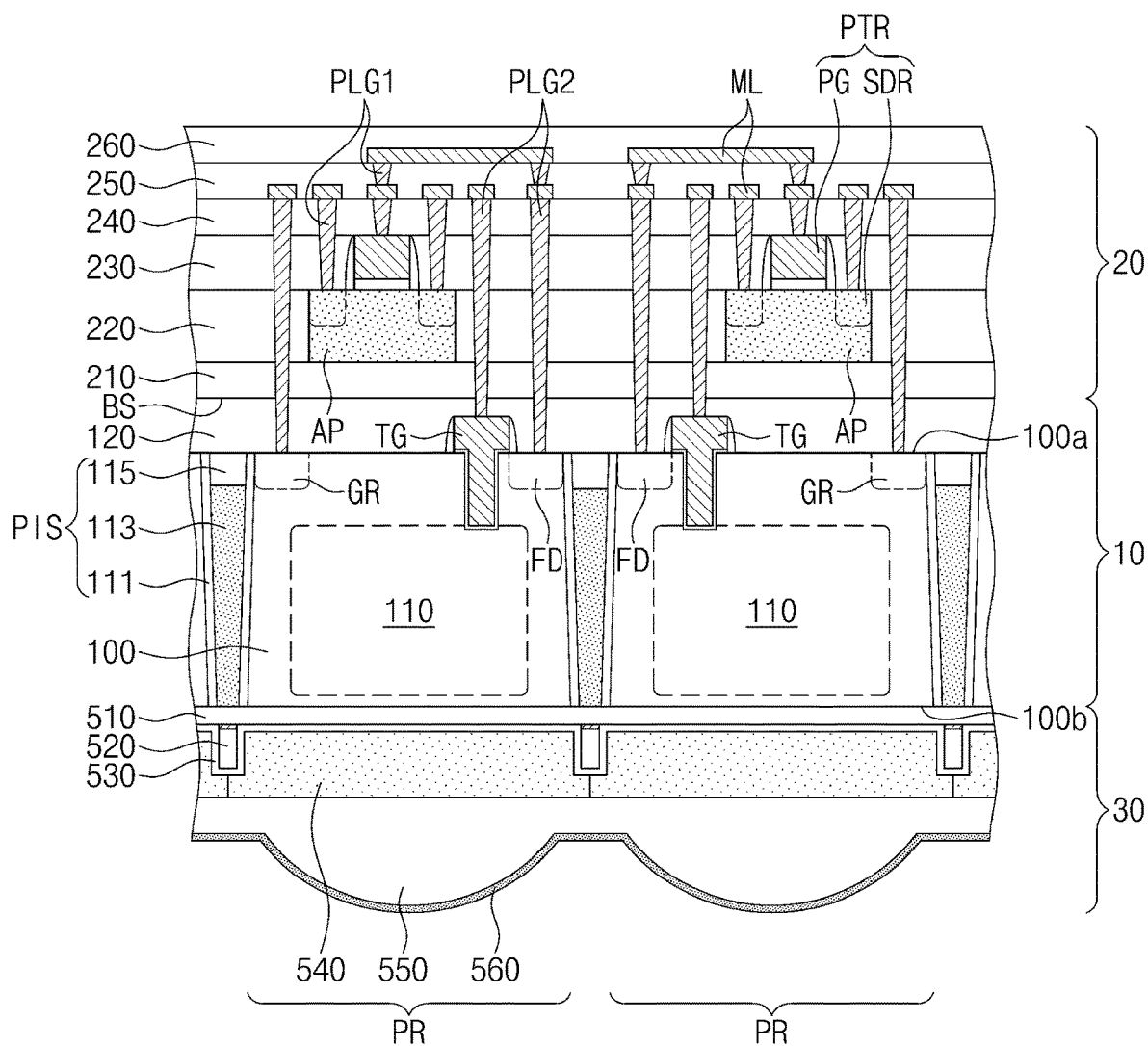
FIG. 5 illustrates a cross-sectional view showing an image sensor according to some embodiments of the present inventive concepts.

FIG. 5 illustrates a cross-sectional view showing an image sensor according to some embodiments of the present inventive concepts.

Referring to FIG. 5, as discussed above, the pixel circuit layer 20 may include a second dielectric layer 210, active patterns AP on the second dielectric layer 210, and pixel transistors PTR on corresponding active patterns AP. According to some embodiments, on the second dielectric layer 210, four pixel transistors PTR may be correspondingly disposed on four pixel regions PR.

For example, as discussed above, the active patterns AP may be laterally spaced apart from each other on the second dielectric layer 210. In a plan view, the active patterns AP may correspondingly overlap the photoelectric conversion regions 110. The active patterns AP may be disposed on the second dielectric layer 210 while being spaced apart from the second contact plugs PLG2.

Figure 6:
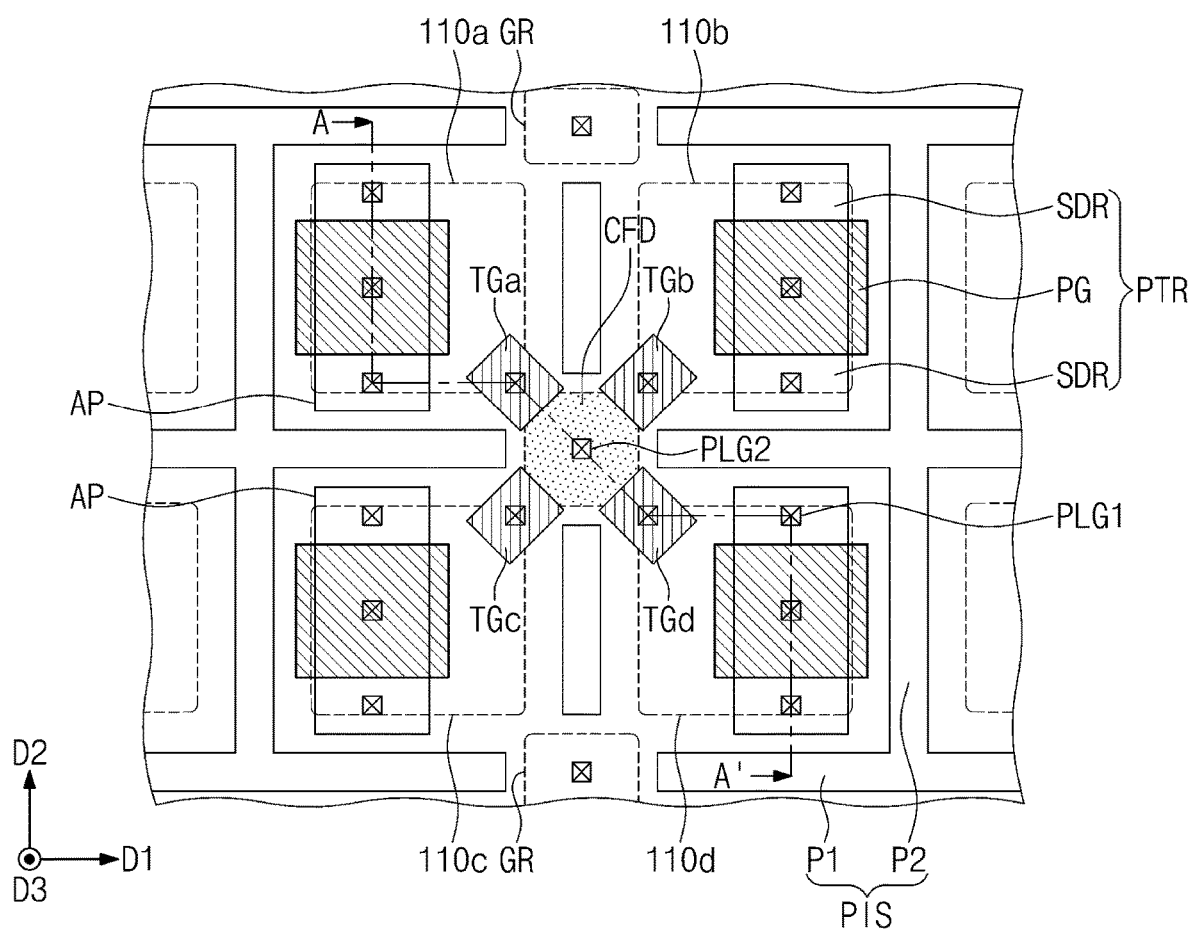
FIG. 6 illustrates a plan view showing a unit pixel of an image sensor according to some embodiments of the present inventive concepts.
Figure 7:
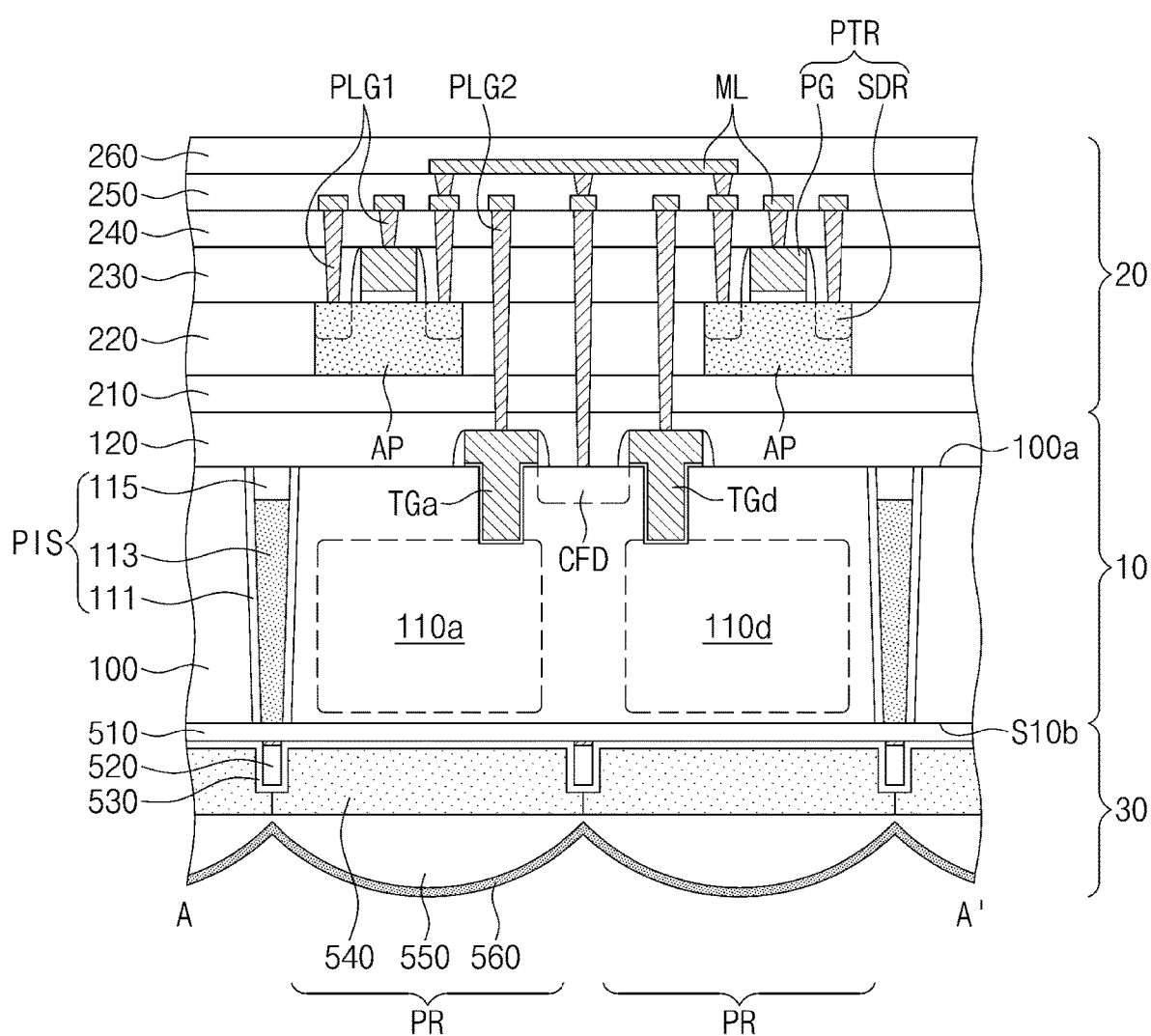
FIG. 7 illustrates a cross-sectional view taken along line A-A' of FIG. 6, showing an image sensor according to some embodiments of the present inventive concepts.

FIG. 6 illustrates a plan view showing a unit pixel of an image sensor according to some embodiments of the present inventive concepts. FIG. 7 illustrates a cross-sectional view showing an image sensor according to some embodiments of the present inventive concepts.

Referring to FIGS. 6 and 7, an image sensor according to some embodiments of the present inventive concepts may include a photoelectric conversion circuit layer 10 including a first semiconductor substrate 100, a pixel isolation structure PIS, first to fourth photoelectric conversion regions 110a to 110d, first to fourth transfer gate electrodes TGa to TGd, and a common floating diffusion region CFD.

The pixel isolation structure PIS may be disposed in the first semiconductor substrate 100 and may define a plurality of pixel regions PR that are arranged two-dimensionally. The pixel isolation structure PIS may include first parts P1 that extend parallel to each other along the first direction D1 and second parts P2 that extend parallel to each other along the second direction D2 while running across the first parts P1. In this case, a portion of the first part P1 and a portion of the second part P2 may be spaced apart from each other across the common floating diffusion region CFD.

In a plan view, the first to fourth photoelectric conversion regions 110a to 110d may be arranged in a matrix shape along the first direction D1 and the second direction D2. The pixel isolation structure PIS may cause the first to fourth photoelectric conversion regions 110a to 110d to be separated from each other. The pixel isolation structure PIS may be disposed between the first and second photoelectric conversion regions 110a and 110b that are adjacent to each other in the first direction D1, between the third and fourth photoelectric conversion regions 110c and 110d that are adjacent to each other in the first direction D1, between the first and third photoelectric conversion regions 110a and 110c that are adjacent to each other in the second direction D2, and between the second and fourth photoelectric conversion regions 110b and 110d that are adjacent to each other in the second direction D2.

The first semiconductor substrate 100 may be disposed therein with the common floating diffusion region CFD adjacent to the first to fourth photoelectric conversion regions 110a to 110d. The common floating diffusion region CFD may be formed by implanting the first semiconductor substrate 100 with second conductivity impurities (e.g., n-type impurities).

The first to fourth transfer gate electrodes TGa to TGd may be disposed on the first surface 100a of the first semiconductor substrate 100. The first to fourth transfer gate electrodes TGa to TGd may be disposed between the common floating diffusion region CFD and the first to fourth photoelectric conversion regions 110a to 110d, respectively.

A gate dielectric layer may be interposed between the first surface 100a of the first semiconductor substrate 100 and each of the first to fourth transfer gate electrodes TGa to TGd.

In a plan view, the ground impurity regions GR may be disposed between the first parts P1 of the pixel isolation structure PIS and between the second parts P2 of the pixel isolation structure PIS.

On the first surface 100a of the first semiconductor substrate 100, the first dielectric layer 120 may cover the first to fourth transfer gate electrodes TGa to TGd.

As discussed above, the pixel circuit layer 20 may include a second dielectric layer 210, active patterns AP on the second dielectric layer 210, and pixel transistors PTR on corresponding active patterns AP.

The second dielectric layer 210 and the first dielectric layer 120 may be bonded to constitute a bonding surface BS. As discussed above, the active patterns AP may be disposed spaced apart from each other on the second dielectric layer 210. Each of the active patterns AP may have a major axis in the second direction D2 on the second dielectric layer 210. In a plan view, the active patterns AP may correspondingly overlap the first to fourth photoelectric conversion regions 110a to 110d. The active patterns AP may be disposed spaced apart from the second contact plugs PLG2.

The pixel transistors PTR may be correspondingly disposed on the active patterns AP, and each of the pixel transistors PTR may include a pixel gate electrode PG that runs across the active pattern AP and source/drain regions SDR that are disposed in the active pattern AP on opposite sides of the pixel gate electrode PG.

Figure 8A:
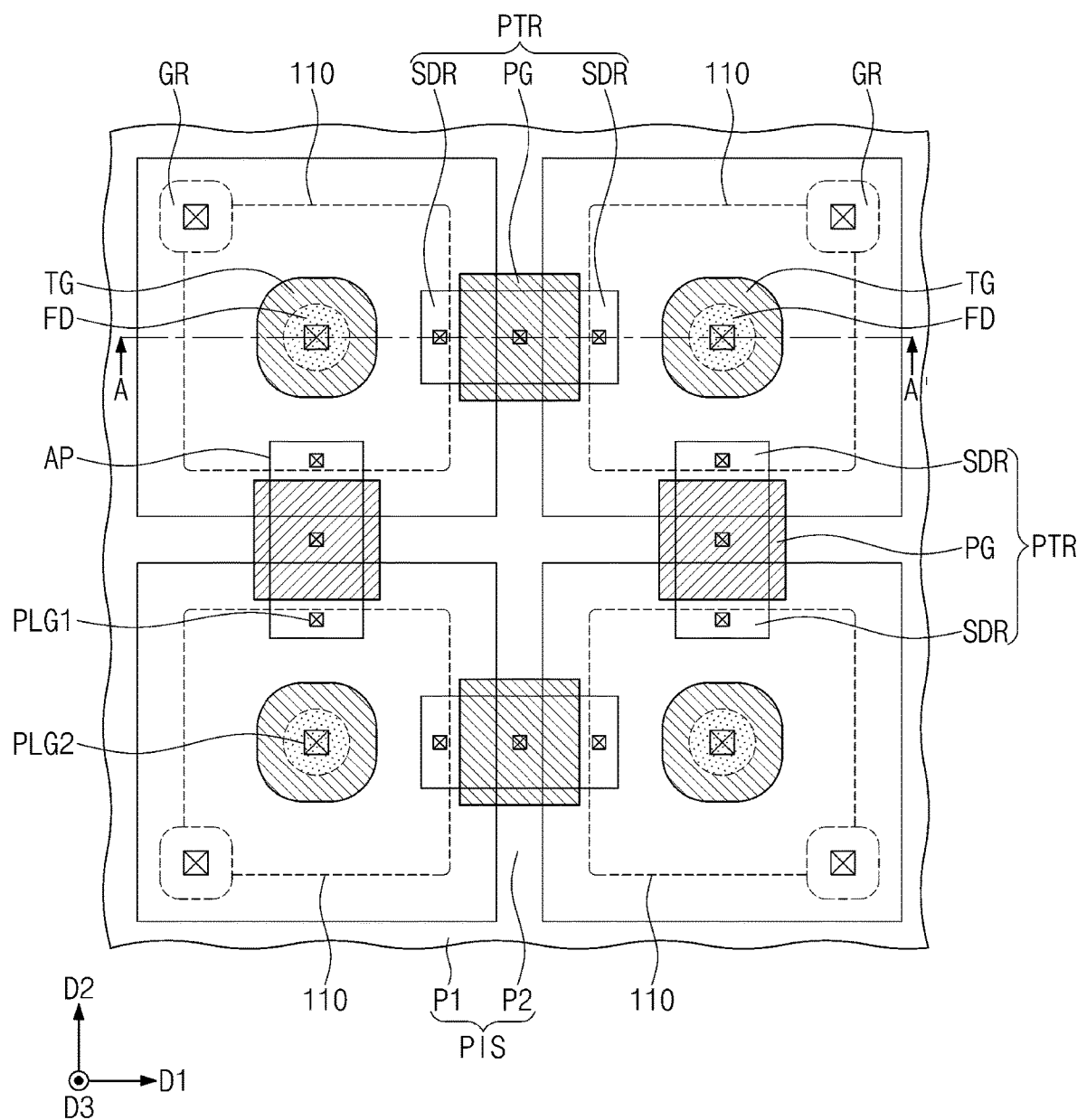
FIG. 8A illustrates a plan view showing a unit pixel of an image sensor according to some embodiments of the present inventive concepts.
Figure 8B:
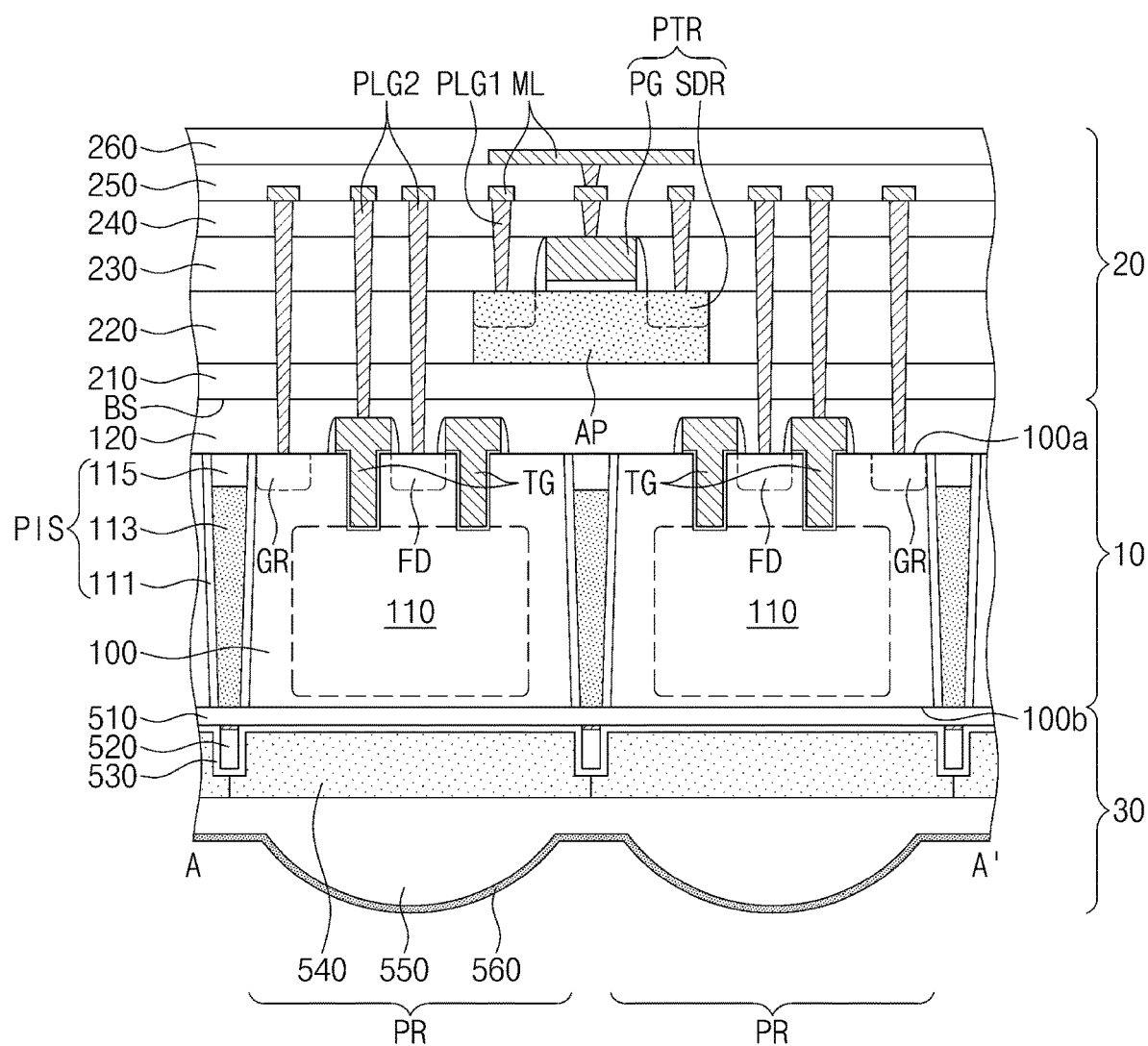
FIG. 8B illustrates a cross-sectional view taken along line A-A' of FIG. 8A, showing an image sensor according to some embodiments of the present inventive concepts.

FIG. 8A illustrates a plan view showing a unit pixel of an image sensor according to some embodiments of the present inventive concepts. FIG. 8B illustrates a cross-sectional view taken along line A-A' of FIG. 8A, showing an image sensor according to some embodiments of the present inventive concepts.

According to the embodiment shown in FIGS. 8A and 8B, the transfer gate electrode TG of each pixel region PR may have a ring or tube shape in a plan view.

The transfer gate electrode TG may be positioned on a central portion of the photoelectric conversion region 110. In a plan view, the transfer gate electrode TG may overlap the photoelectric conversion region 110.

A portion of the transfer gate electrode TG may be disposed in the first semiconductor substrate 100. The transfer gate electrode TG may have a bottom surface located at a lower level than that of the first surface 100a of the first semiconductor substrate 100.

The floating diffusion region FD may be positioned on the central portion of the photoelectric conversion region 110 and may be vertically spaced apart from the photoelectric conversion region 110. The floating diffusion region FD may be surrounded by the transfer gate electrode TG that has a ring shape. In a plan view, the floating diffusion region FD may vertically overlap the photoelectric conversion region 110.

In a plan view, each of the active patterns AP may partially overlap the photoelectric conversion regions 110. Each of the active patterns AP may overlap two photoelectric conversion regions 110 that are adjacent to each other. In a plan view, each of the active patterns AP may overlap a portion of the pixel isolation structure PIS. The active pattern AP may overlap a portion of the transfer gate electrode TG.

Figure 9:
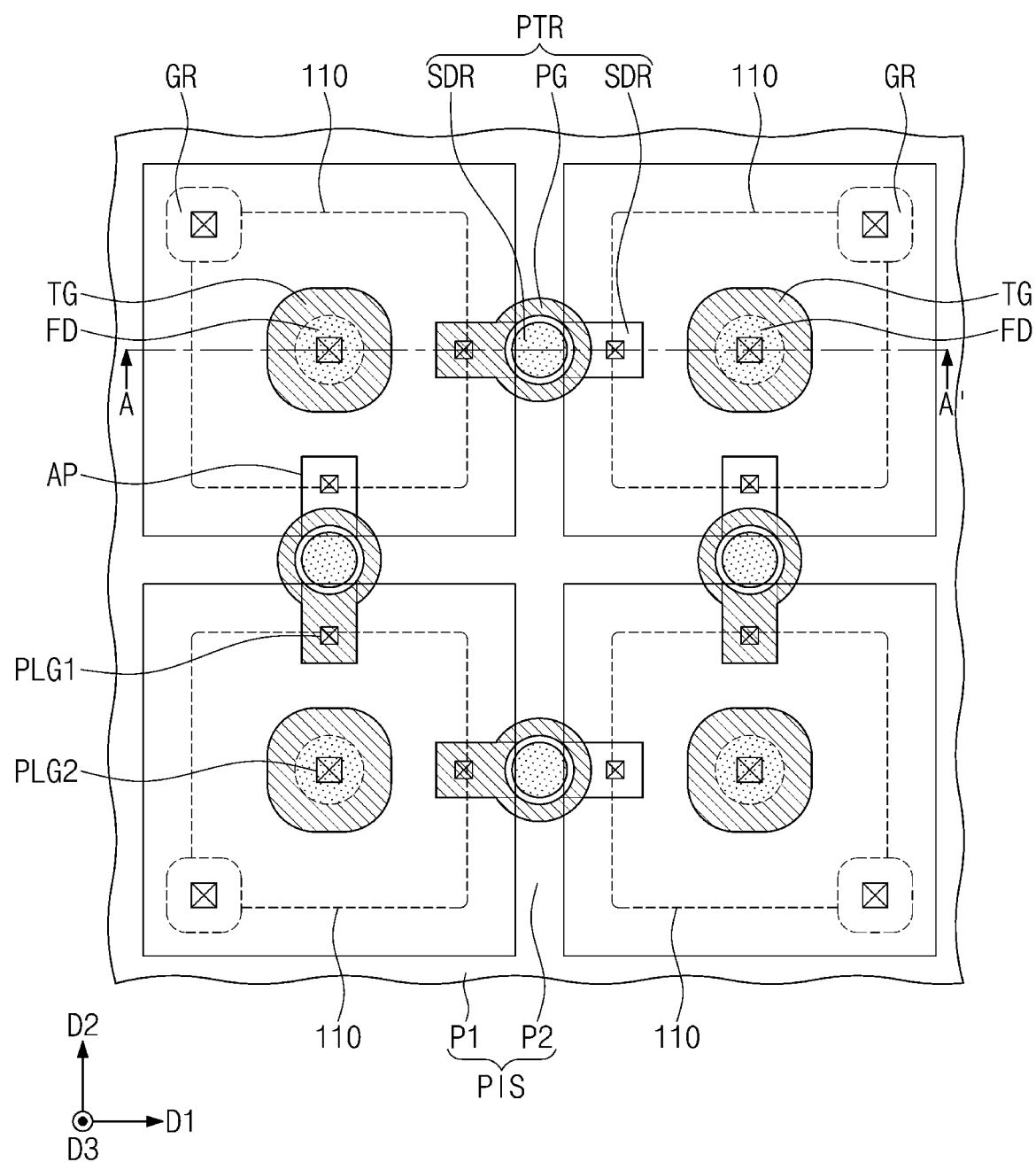
FIG. 9 illustrates a plan view showing a unit pixel of an image sensor according to some embodiments of the present inventive concepts.
Figure 10:
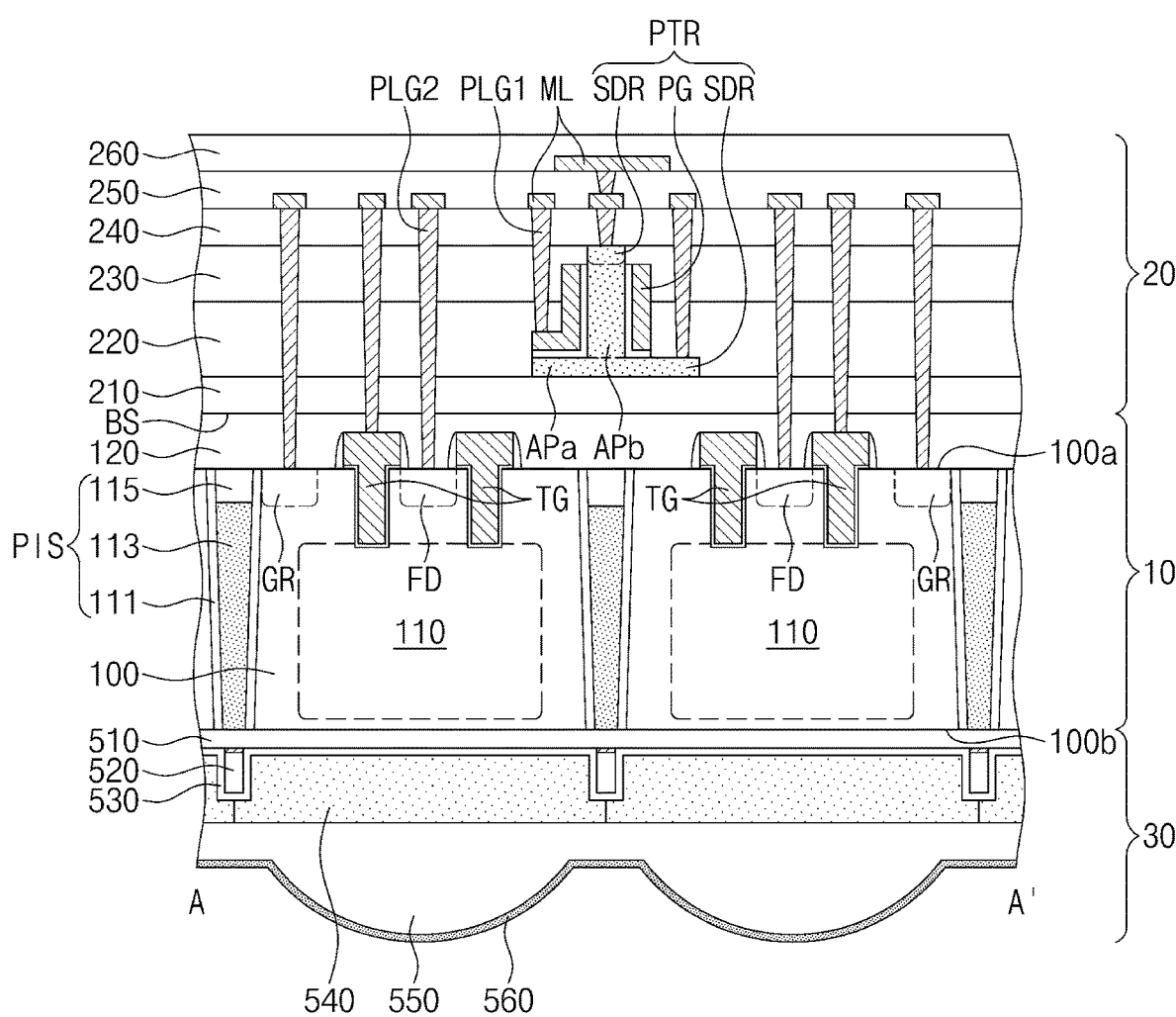
FIG. 10 illustrates a cross-sectional view taken along line A-A' of FIG. 9, showing an image sensor according to some embodiments of the present inventive concepts.

FIG. 9 illustrates a plan view showing a unit pixel of an image sensor according to some embodiments of the present inventive concepts. FIG. 10 illustrates a cross-sectional view taken along line A-A' of FIG. 9, showing an image sensor according to some embodiments of the present inventive concepts.

Referring to FIGS. 9 and 10, as discussed above with reference to FIGS. 8A and 8B, the photoelectric conversion circuit layer 10 may include ring-shaped transfer gate electrodes TG. The transfer gate electrodes TG may be correspondingly disposed on the photoelectric conversion regions 110.

The pixel circuit layer 20 may include active patterns AP on the second dielectric layer 210. In some embodiments, each of the active patterns AP may include a horizontal part APa on the second dielectric layer 210 and a vertical part APb that protrudes in a third direction D3 perpendicular to the first and second directions D1 and D2.

Each of the pixel transistors PTR may be a three-dimensional field effect transistor (e.g., gate-all-around field effect transistor (GAAFET)) in which the transfer gate electrode TG three-dimensionally surrounds the vertical part APb of the active pattern AP. Each of the pixel transistors PTR may include the pixel gate electrode PG and the source/drain regions SDR.

The pixel gate electrode PG may have a structure (e.g., gate-all-around structure) that completely surrounds the vertical part APb of the active pattern AP. The pixel gate electrode PG may include a gate part that completely surrounds the vertical part APb and a contact part that laterally protrudes from the gate part. One of the first contact plugs PLG1 may be coupled to the contact part of the pixel gate electrode PG.

The source/drain regions SDR may be vertically spaced apart from each other in the active pattern AP.

Figure 11:
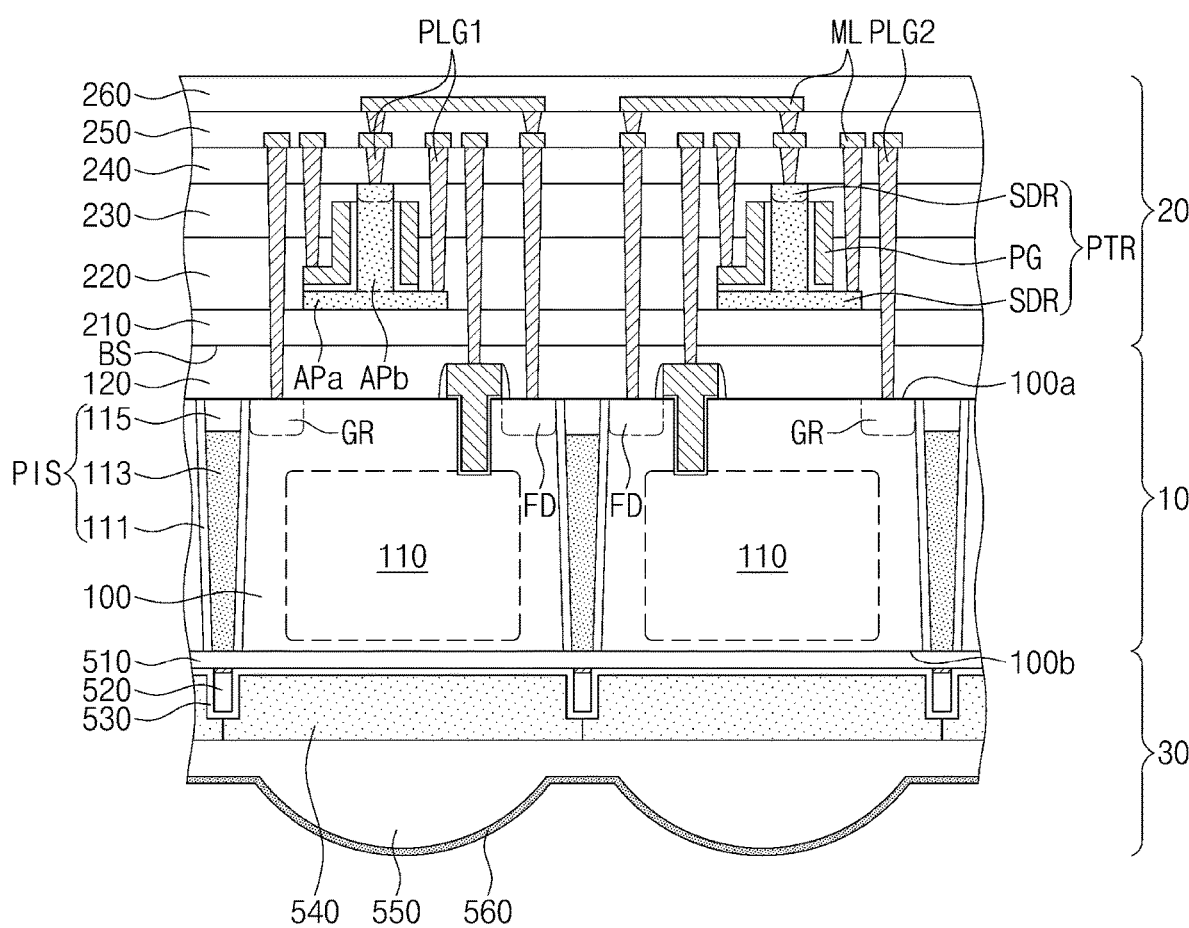
FIG. 11 illustrates a cross-sectional view showing an image sensor according to some embodiments of the present inventive concepts.

FIG. 11 illustrates a cross-sectional view showing an image sensor according to some embodiments of the present inventive concepts.

Referring to FIG. 11, as discussed above with reference to FIGS. 3, 4A, and 4B, the photoelectric conversion circuit layer 10 may be configured such that the floating diffusion region FD may be disposed in the first semiconductor substrate 100 on one side of each transfer gate electrode TG.

The pixel transistor PTR may overlap the photoelectric conversion region 110. The pixel transistor PTR may include an active pattern AP, a pixel gate electrode PG, and source/drain regions SDR, and as discussed above with reference to FIG. 10, the active pattern AP may include a horizontal part APa on the second dielectric layer 210 and a vertical part APb that protrudes in the third direction D3 perpendicular to the first and second directions D1 and D2.

The active patterns AP may correspondingly overlap the photoelectric conversion regions 110 and may be spaced apart from the second contact plugs PLG2. The pixel gate electrode PG may have a gate-all-around structure that completely surrounds the vertical part APb of the active pattern AP.

Figure 12:
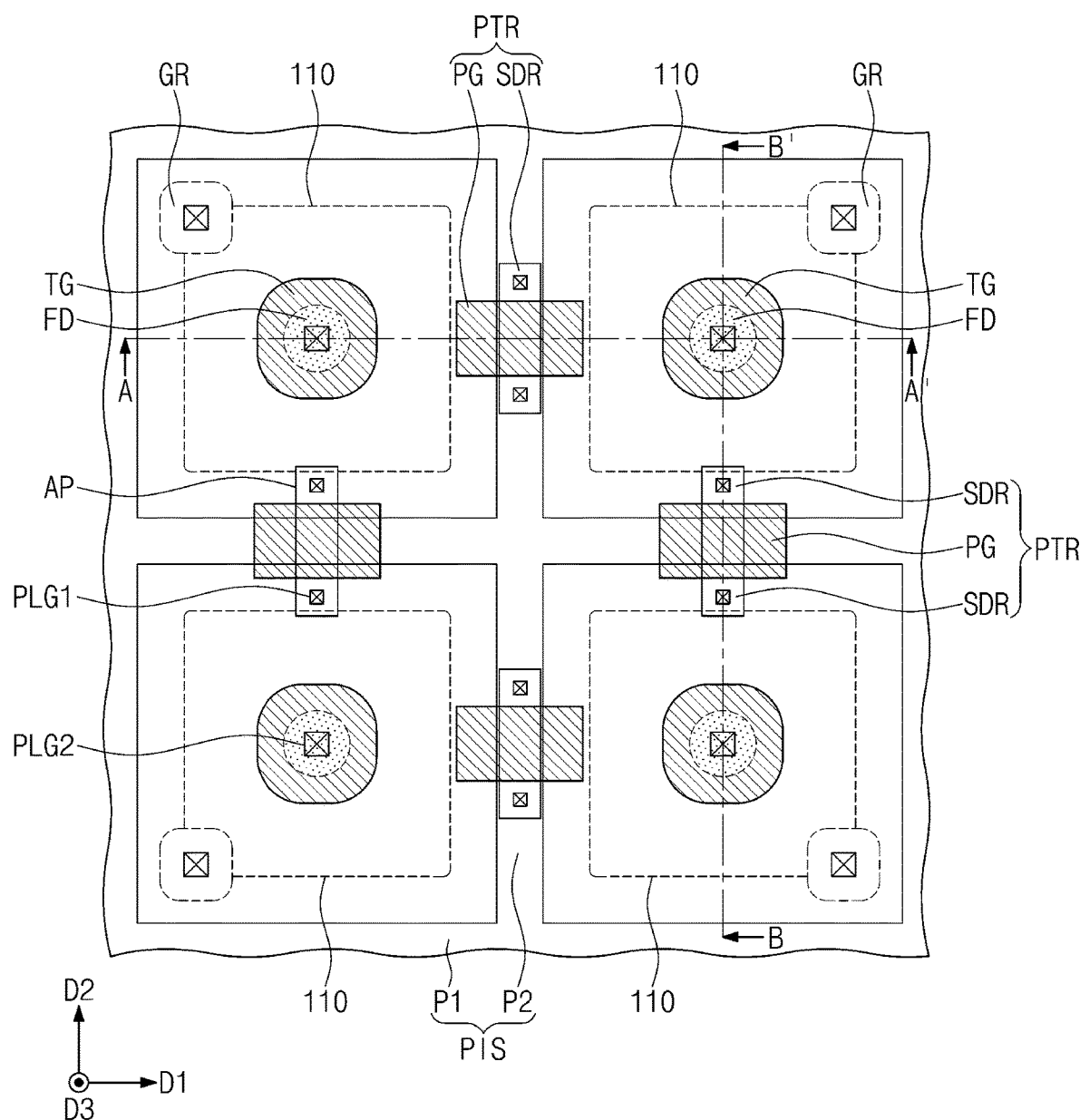
FIG. 12 illustrates a plan view showing an image sensor according to some embodiments of the present inventive concepts.
Figure 13A:
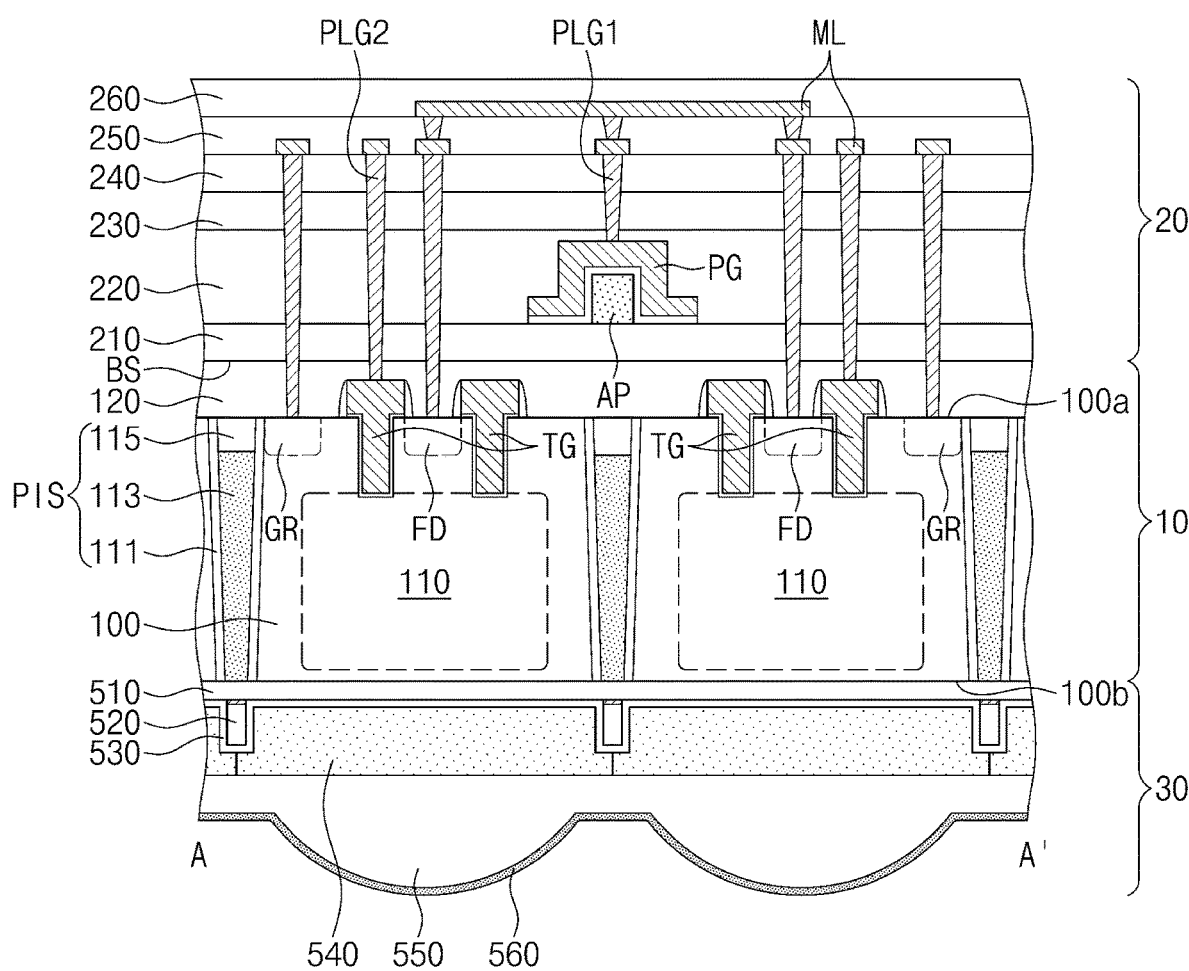
FIGS. 13A and 13B illustrate cross-sectional views respectively taken along lines A-A' and B-B' of FIG. 12, showing an image sensor according to some embodiments of the present inventive concepts.
Figure 13B:
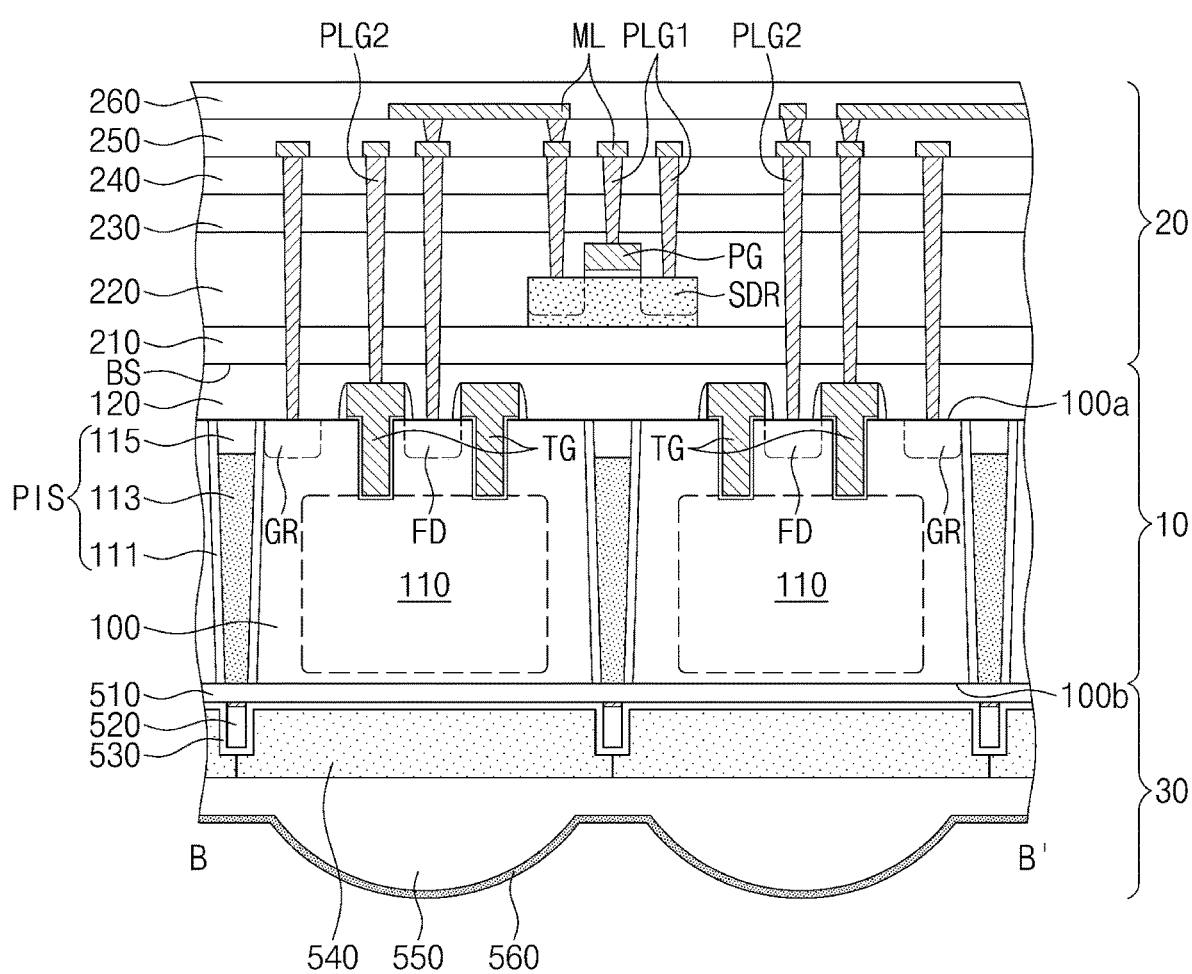

FIG. 12 illustrates a plan view showing an image sensor according to some embodiments of the present inventive concepts. FIGS. 13A and 13B illustrate cross-sectional views respectively taken along lines A-A' and B-B' of FIG. 12, showing an image sensor according to some embodiments of the present inventive concepts.

Referring to FIGS. 12, 13A, and 13B, the photoelectric conversion circuit layer 10 may include a first semiconductor substrate 100, a pixel isolation structure PIS, a photoelectric conversion region 110, a transfer gate electrode TG, a floating diffusion region FD, and a first dielectric layer 120.

As discussed above with reference to FIGS. 3, 4A, and 4B, the pixel isolation structure PIS may include first parts P1 and second parts P2 that intersect each other.

The transfer gate electrode TG of each pixel region PR may have a ring or tube shape, as discussed above with reference to FIGS. 8A and 8B.

According to some embodiments, a fin-type field effect transistor (FET) may be used as the pixel transistor PTR of the pixel circuit layer 20. The pixel gate electrode PG may three-dimensionally control a fin-type active pattern AP.

For example, the active pattern AP may be formed to have a fin type on the second dielectric layer 210. The fin-type active pattern AP may have a major axis in the first direction D1 or the second direction D2 and may overlap at least a portion of the pixel isolation structure PIS.

The pixel gate electrode PG may at least partially surround opposite sidewalls and a top surface of the active pattern AP at a channel region between the source/drain regions SDR. A gate dielectric layer may be interposed between the pixel gate electrode PG and the active pattern AP.

Figure 14:
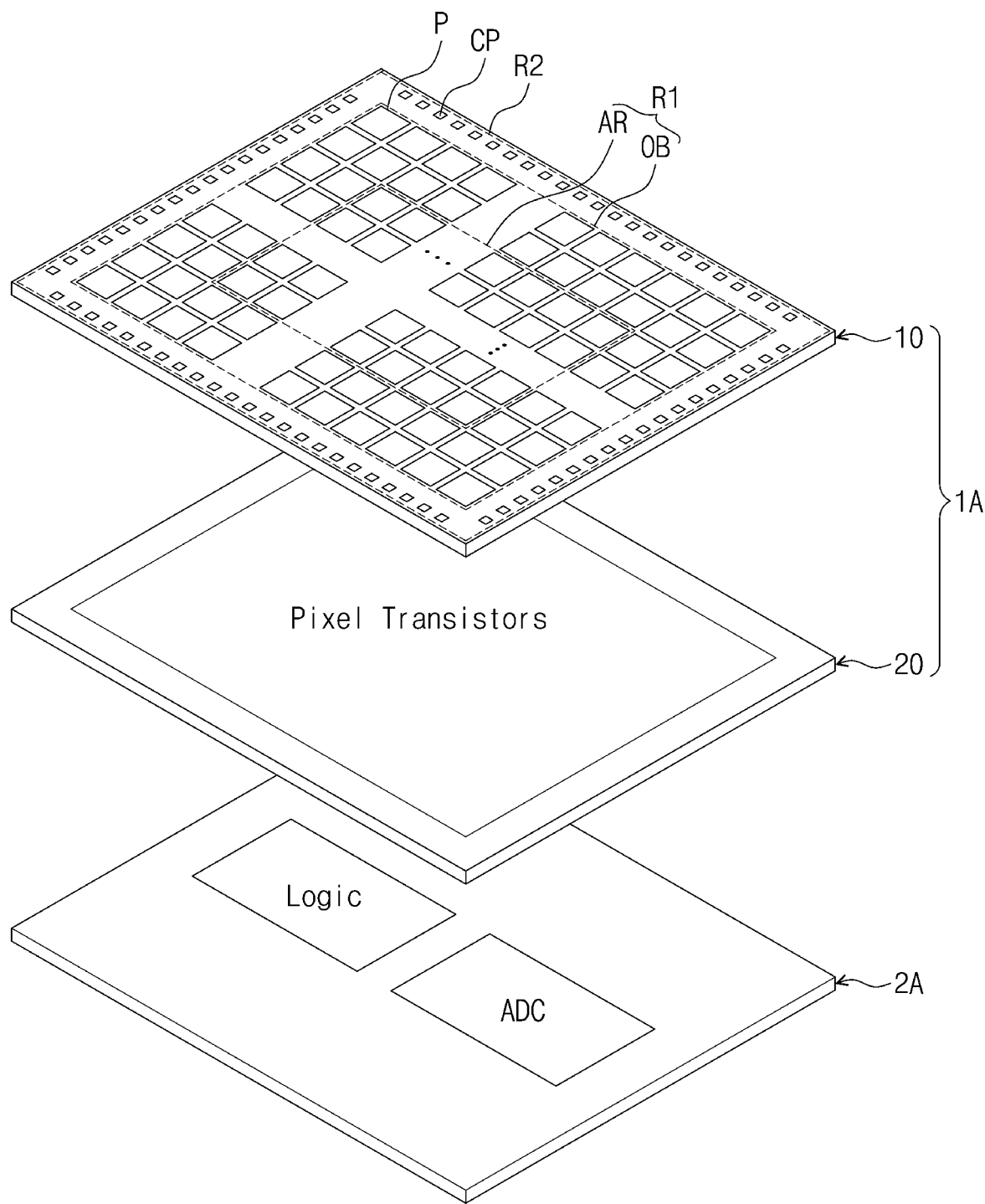
FIG. 14 illustrates a simplified perspective view showing an image sensor according to some embodiments of the present inventive concepts.
Figure 15:
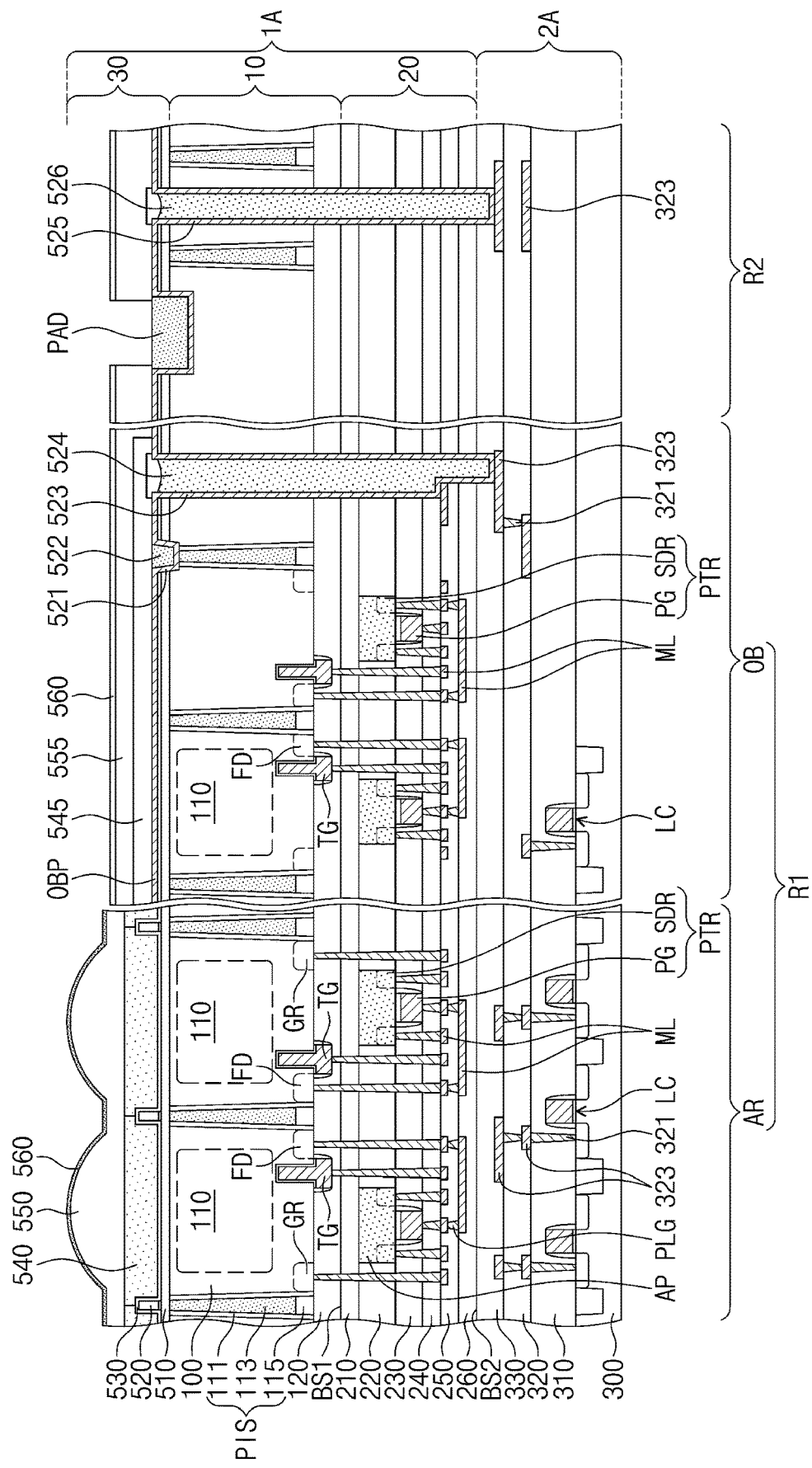
FIGS. 15 and 16 illustrate cross-sectional views showing an image sensor according to some embodiments of the present inventive concepts.
Figure 16:
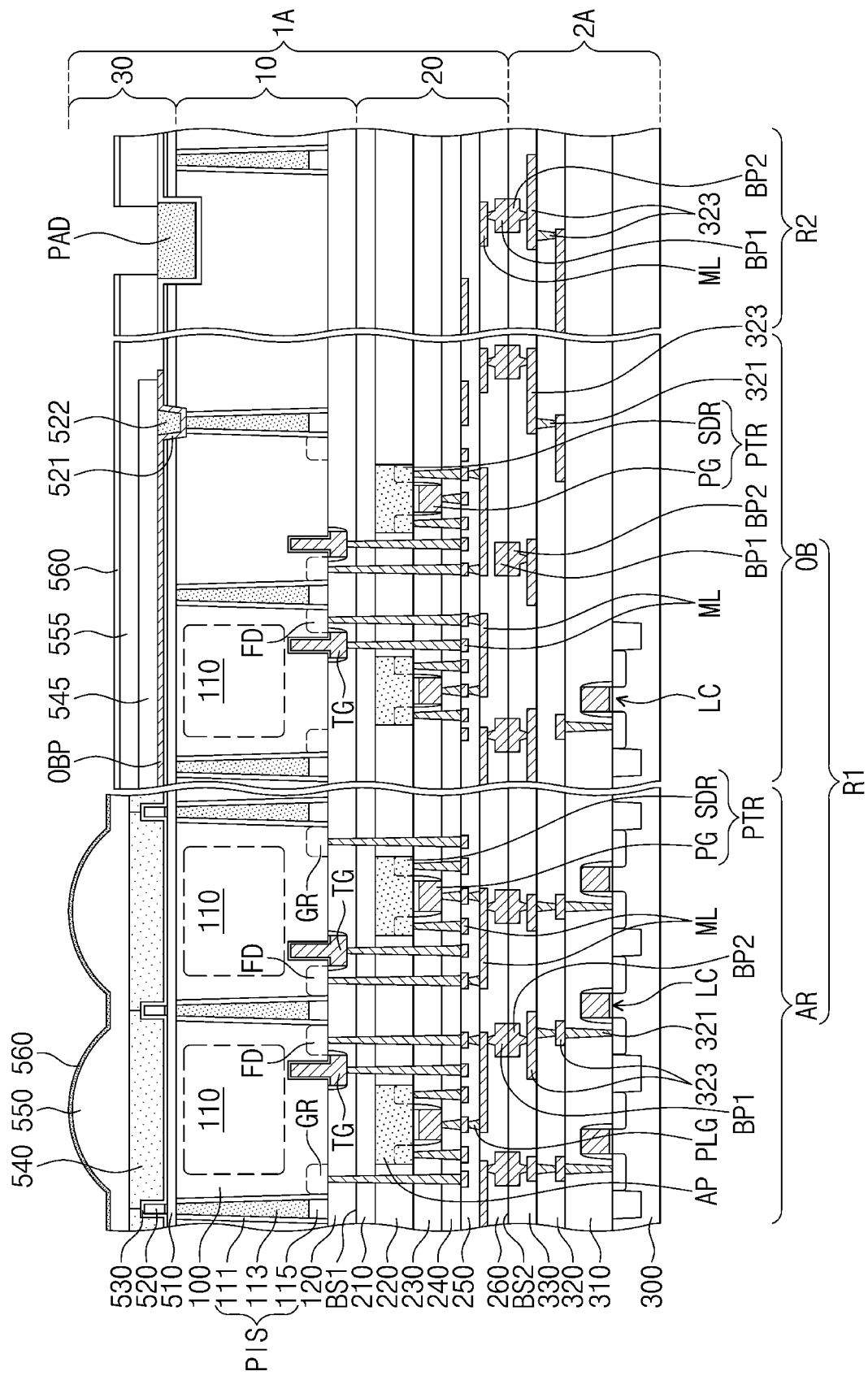

FIG. 14 illustrates a simplified perspective view showing an image sensor according to some embodiments of the present inventive concepts. FIGS. 15 and 16 illustrate cross-sectional views showing an image sensor according to some embodiments of the present inventive concepts.

Referring to FIGS. 14 and 15, an image sensor may include a sensor circuit layer 1A (or sensor chip) and a logic circuit layer 2A (or logic chip).

The sensor circuit layer 1A may convert images into electrical signals or data signals. The sensor circuit layer 1A, as discussed above, may include a photoelectric conversion circuit layer 10, a pixel circuit layer 20, and an optical transmission layer 30.

The sensor circuit layer 1A may include a pixel array zone R1 and a pad zone R2. The pixel array zone R1 may include a plurality of unit pixels P that are two-dimensionally arranged along first and second directions D1 and D2 that intersect each other. Each of the unit pixels P may include a photoelectric conversion element and readout elements. Each unit pixel P of the pixel array zone R1 may output electrical signals converted from incident light.

On a light-receiving area AR, the sensor circuit layer 1A may have technical characteristics at least similar to those of the image sensor discussed above.

In a plan view, a light-shielding area OB may at least partially surround the light-receiving area AR. For example, in a plan view, the light-shielding area OB may be disposed on upside, downside, left-side, and right-side of the light-receiving area AR. The light-shielding area OB may include reference pixels on which no or little light is incident, and an amount of charge sensed in the unit pixels P of the light-receiving area AR may be compared with a reference amount of charge generated from the reference pixels, which may result in obtaining magnitudes of electrical signals sensed in the unit pixels P.

A pixel isolation structure PIS may define pixel regions on the light-receiving area AR and the light-shielding area OB, and a portion of the pixel isolation structure PIS may be electrically connected to a contact plug on the light-shielding area OB.

When viewed in vertical cross-section, the photoelectric conversion circuit layer 10 may be disposed between the pixel circuit layer 20 and the optical transmission layer 30. As discussed above, the photoelectric conversion circuit layer 10 may include a first semiconductor substrate 100, a pixel isolation structure PIS, a photoelectric conversion region 110, a transfer gate electrode TG, a floating diffusion region FD, and a first dielectric layer 120.

The pixel circuit layer 20 may include a second dielectric layer 210, active patterns AP on the second dielectric layer 210, and the pixel transistors PTR on corresponding active patterns AP. The second dielectric layer 210 and the first dielectric layer 120 may be bonded to constitute a first bonding surface BS1. The pixel transistors PTR may be connected through first and second contact plugs PLG to the photoelectric conversion circuit layer 10.

The optical transmission layer 30 may include a planarized dielectric layer 510, a grid structure 520, a protection layer 530, color filters 540, micro-lenses 550, and a passivation layer 560.

The planarized dielectric layer 510 may extend from the light-receiving area AR toward the light-shielding area OB and the pad zone R2.

On the light-shielding area OB, a light-shielding pattern OBP may be disposed on the planarized dielectric layer 510. The light-shielding pattern OBP may block incidence of light onto the photoelectric conversion regions 110 disposed on the light-shielding area OB. On the pixel regions PR of the light-shielding area OB, the photoelectric conversion regions 110 may output noise signals without outputting photoelectrical signals. The noise signals may be generated from electrons produced due to heat or dark current. The light-shielding pattern OBP may include metal, such as tungsten, copper, aluminum, or any alloy thereof.

A filtering layer 545 may be disposed on the light-shielding pattern OBP. The filtering layer 545 may block light whose wavelength is different from that of light produced from the color filters 540. For example, the filtering layer 545 may block infrared light. The filtering layer 545 may include a blue color filter, but the present inventive concepts are not necessarily limited thereto.

A contact pad plug 521 may be disposed on the second surface 100b of the first semiconductor substrate 100 on the light-shielding area OB. A contact trench may be formed on the second surface 100b of the first semiconductor substrate 100, and the contact pad plug 521 may be disposed in the contact trench.

A contact pad 522 may be connected to the contact pad plug 521. The contact pad 522 may include a conductive material that is different from that of the contact pad plug 521. For example, the contact pad 522 may include aluminum. The contact pad 522 may be electrically connected to the semiconductor pattern 113 of the pixel isolation structure PIS. A negative bias may be applied thorough the contact pad 522 to the semiconductor pattern 113 of the pixel isolation structure PIS, and a certain bias may be transmitted to the pixel array zone R1.

The logic circuit layer 2A may be bonded to the sensor circuit layer 1A so as to allow the logic circuit layer 2A to become adjacent to the pixel circuit layer 20. The logic circuit layer 2A may include a power circuit, an input/output interface, and an image signal processor.

For example, the logic circuit layer 2A may include a logic semiconductor substrate 300, logic circuits LC, logic contact plugs 321 connected to the logic circuits LC, logic conductive lines 323, and logic interlayer dielectric layers 310, 320, and 330. An uppermost one 330 of the logic interlayer dielectric layers 310, 320, and 330 may be coupled to the pixel circuit layer 20 of the sensor circuit layer 1A. The uppermost logic interlayer dielectric layer 330 may be coupled to an uppermost interlayer dielectric layer 260 of the pixel circuit layer 20, thereby forming a second bonding surface BS2.

The logic circuit layer 2A may be electrically connected to the sensor circuit layer 1A through a first through conductive pattern 523 and a second through conductive pattern 525.

For example, on the light-shielding area OB, the first through conductive pattern 523 may penetrate the first semiconductor substrate 100 to electrically connect with the conductive line ML of the pixel circuit layer 20 and with a wiring structure of the logic circuit layer 2A. The first through conductive pattern 523 may have a first bottom surface and a second bottom surface that are located at different levels. A first buried pattern 524 may be disposed in the first through conductive pattern 523. The first buried pattern 524 may include a low-refractive material and may have dielectric properties.

On the pad zone R2, the first semiconductor substrate 100 may be disposed on its second surface 100b with a plurality of conductive pads CP used for input/output of control signals and photoelectric conversion signals. For easy connection with external devices, in a plan view, the pad zone R2 may at least partially surround the pixel array zone R1. The conductive pads CP may allow an external device to receive electrical signals generated from the unit pixels P.

On the pad zone R2, conductive pads PAD may be buried in the second surface 100b of the first semiconductor substrate 100. For example, on the pad zone R2, the conductive pads PAD may be disposed in pad trenches formed on the second surface 100b of the first semiconductor substrate 100. The conductive pads PAD may include metal, such as aluminum, copper, tungsten, titanium, tantalum, or any alloy thereof. In a mounting process of an image sensor, bonding wires may be bonded to the conductive pads PAD. The conductive pads PAD may be electrically connected through the bonding wires to an external device.

On the pad zone R2, the second through conductive pattern 525 may penetrate the first semiconductor substrate 100 to electrically connect with the logic conductive line 323 of the logic circuit layer 2A. The second through conductive pattern 525 may extend onto the second surface 100b of the first semiconductor substrate 100 to electrically connect with the conductive pad. A portion of the second through conductive pattern 525 may cover a bottom surface and a sidewall of the conductive pad. A second buried pattern 526 may be disposed in the second through conductive pattern 525. The second buried pattern 526 may include a low-refractive material and may have dielectric properties. On the pad zone R2, the pixel isolation structure PIS may be disposed around the second through conductive pattern 525.

In some embodiments, it is discussed that the sensor circuit layer 1A and the logic circuit layer 2A are electrically connected to each other through the first and second through conductive patterns 523 and 525, but the present inventive concepts are not necessarily limited thereto.

According to the embodiment shown in FIG. 16, neither the first through conductive pattern 511 nor the second through conductive pattern 513 shown in FIG. 15 may be omitted, and the sensor circuit layer 1A and the logic circuit layer 2A may be electrically connected to each other through direct coupling between bonding pads BP1 and BP2 disposed on uppermost metal layers of the sensor circuit layer 1A and the logic circuit layer 2A.

For example, an image sensor may be configured such that the sensor circuit layer 1A may include first bonding pads BP1 disposed on an uppermost metal layer of the pixel circuit layer 20, and that the logic circuit layer 2A may include second bonding pads BP2 disposed on an uppermost metal layer of the logic conductive lines 323. The first and second bonding pads BP1 and BP2 may include, for example, tungsten (W), aluminum (Al), copper (Cu), tungsten nitride (WN), tantalum nitride (TaN), and/or titanium nitride (TiN).

A hybrid bonding method may be employed to directly and electrically connect the first bonding pads BP1 of the sensor circuit layer 1A to the second bonding pads BP2 of the logic circuit layer 2A. In this description, the term "hybrid bonding" may denote a bonding method in which two components of the same kind are merged at an interface therebetween. For example, when the first and second bonding pads BP1 and BP2 are formed of copper, a copper-to-copper bonding may be employed to physically and electrically connect the first and second bonding pads BP1 and BP2 to each other. In addition, a dielectric-to-dielectric bonding may be adopted to couple a surface of a dielectric layer included in the sensor circuit layer 1A to a surface of a dielectric layer included in the logic circuit layer 2A.

FIGS. 17 to 26 illustrate cross-sectional views showing a method of fabricating an image sensor according to some embodiments of the present inventive concepts.

Figure 17:
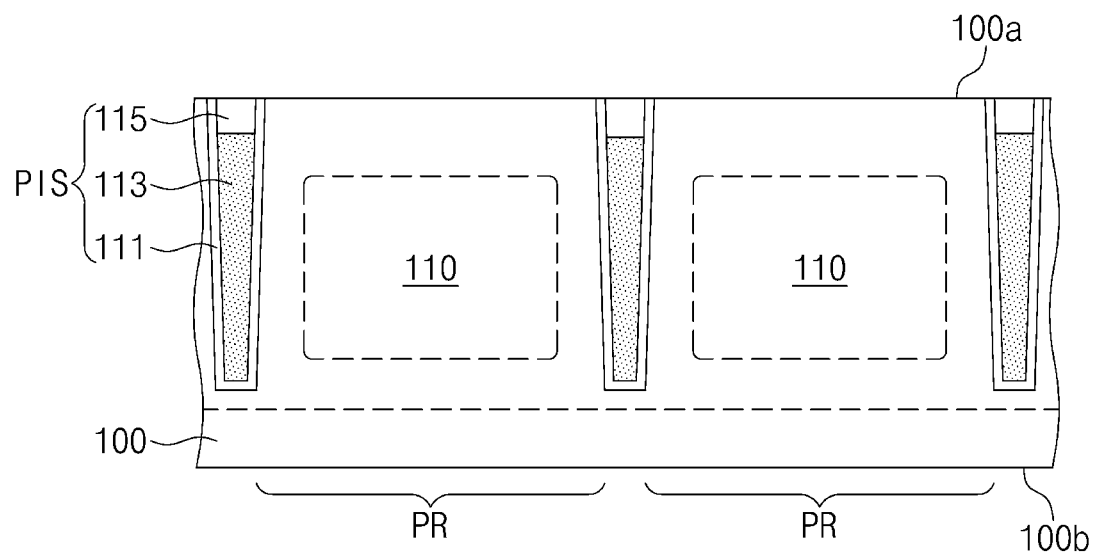
FIGS. 17 to 26 illustrate cross-sectional views showing a method of fabricating an image sensor according to some embodiments of the present inventive concepts.

Referring to FIG. 17, a first semiconductor substrate 100 having a first conductivity type (e.g., p-type) may be used. For example, the first semiconductor substrate 100 may include an epitaxial layer. The first semiconductor substrate 100 may have a first surface 100a and a second surface 100b that are opposite to each other.

A pixel isolation structure PIS may be formed in the first semiconductor substrate 100, defining pixel regions PR. The formation of the pixel isolation structure PIS may include forming a deep trench by patterning the first surface 100a of the first semiconductor substrate 100, forming a liner dielectric layer that conformally covers an inner wall of the deep trench, depositing a semiconductor layer to fill the deep trench in which the liner dielectric layer is formed, and forming in the deep trench a liner dielectric pattern 111, a semiconductor pattern 113, and a capping dielectric pattern 115 by planarizing the liner dielectric layer and the semiconductor pattern 113 so as to expose the first surface 100a of the first semiconductor substrate 100.

The liner dielectric pattern 111 may include, for example, silicon oxide, silicon nitride, and/or silicon oxynitride. The semiconductor pattern 113 may include an impurity-doped polysilicon layer and/or an undoped polysilicon layer.

A plurality of photoelectric conversion regions 110 may be formed in the first semiconductor substrate 100. On the pixel regions PR, the photoelectric conversion regions 110 may be formed by doping the first semiconductor substrate 100 with impurities having a second conductivity type (e.g., n-type) different from the first conductivity type.

Figure 18:
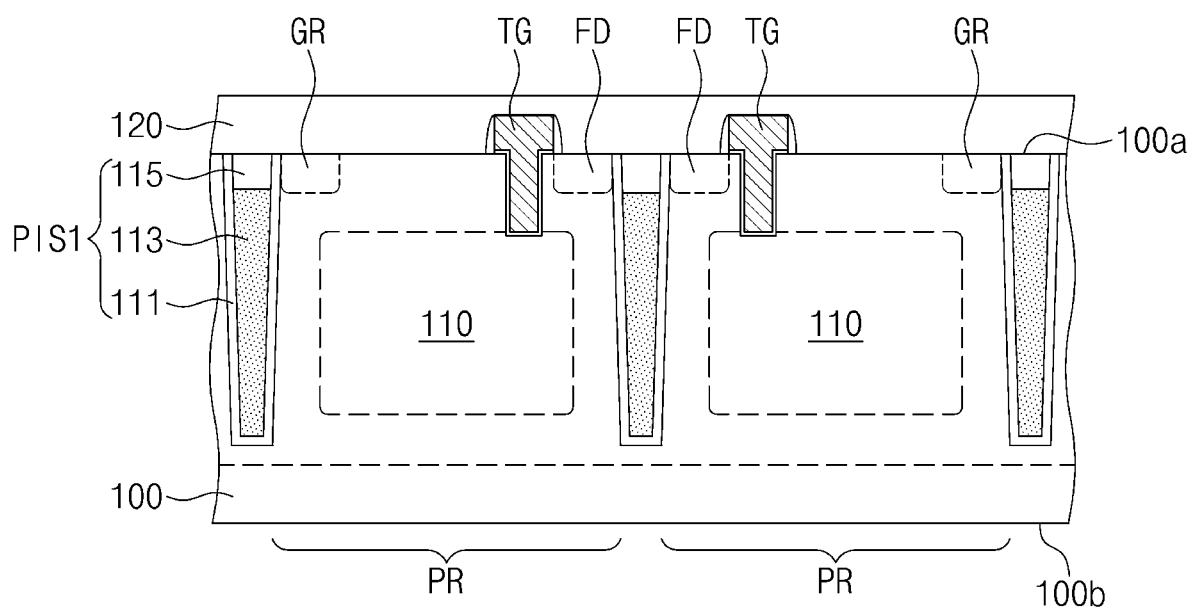

Referring to FIG. 18, transfer gate electrodes TG may be formed on the first surface 100a of the first semiconductor substrate 100 with a gate dielectric layer interposed between the transfer gate electrodes TG and the first surface 100a. A plurality of gate electrodes of readout transistors may also be formed when the transfer gate electrodes TG are formed.

After the formation of the transfer gate electrodes TG, floating diffusion regions FD may be formed in the first semiconductor substrate 100 on sides of the transfer gate electrodes TG. The floating diffusion regions FD may be formed by implanting impurities having the second conductivity type.

In addition, on each of the pixel regions PR, a ground impurity region GR may be formed in the first semiconductor substrate 100. The ground impurity region GR may be formed by doping impurities having the same conductivity type as that of the first semiconductor substrate 100.

A first dielectric layer 120 may be formed on the first semiconductor substrate 100, covering the transfer gate electrodes TG. The first dielectric layer 120 may be formed by depositing a dielectric material to cover the transfer gate electrodes TG, and then a planarization process may be performed on a top surface of the deposited dielectric material. Therefore, the first dielectric layer 120 may have a planarized top surface.

Figure 19:
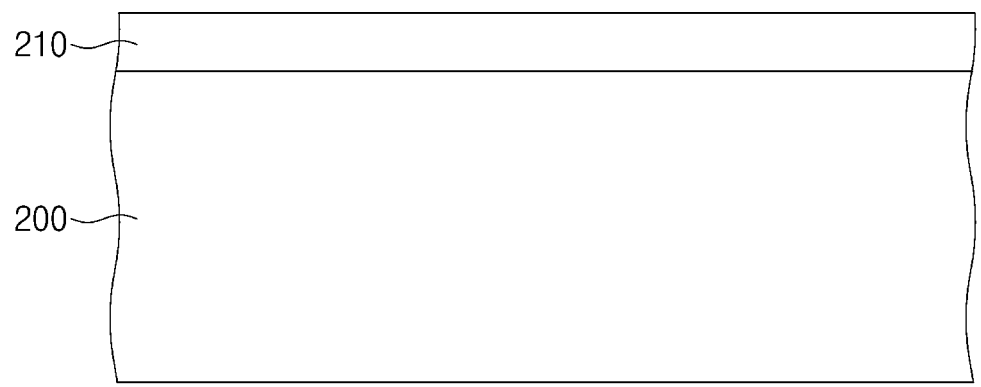

Referring to FIG. 19, a second semiconductor substrate 200 may be prepared which is different from the first semiconductor substrate 100, and a second dielectric layer 210 may be formed on a top surface of the second semiconductor substrate 200.

The second semiconductor substrate 200 may be a bulk silicon substrate or an epitaxial layer formed on a bulk silicon substrate.

The second dielectric layer 210 may include a silicon oxide layer, a silicon nitride layer, and/or a silicon oxynitride layer. The second dielectric layer 210 may be formed by using physical vapor deposition (PVD), chemical vapor deposition (CVD), and/or atomic layer deposition (ALD).

Figure 20:
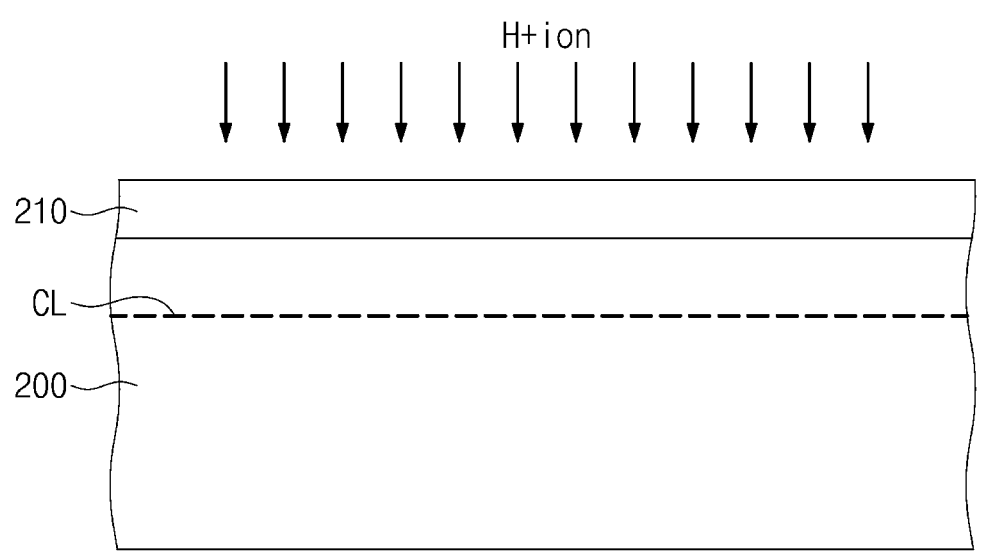

Referring to FIG. 20, an ion implantation process may be performed to form a separation layer CL at a certain depth from the top surface of the second semiconductor substrate 200. The separation layer CL may include hydrogen ions. The depth of the separation layer CL may be determined in accordance with thicknesses of active patterns AP which will be formed in a subsequent process. The second semiconductor substrate 200 may have a reduced lattice bonding of silicon at the separation layer CL formed by the ion implantation process.

Figure 21:
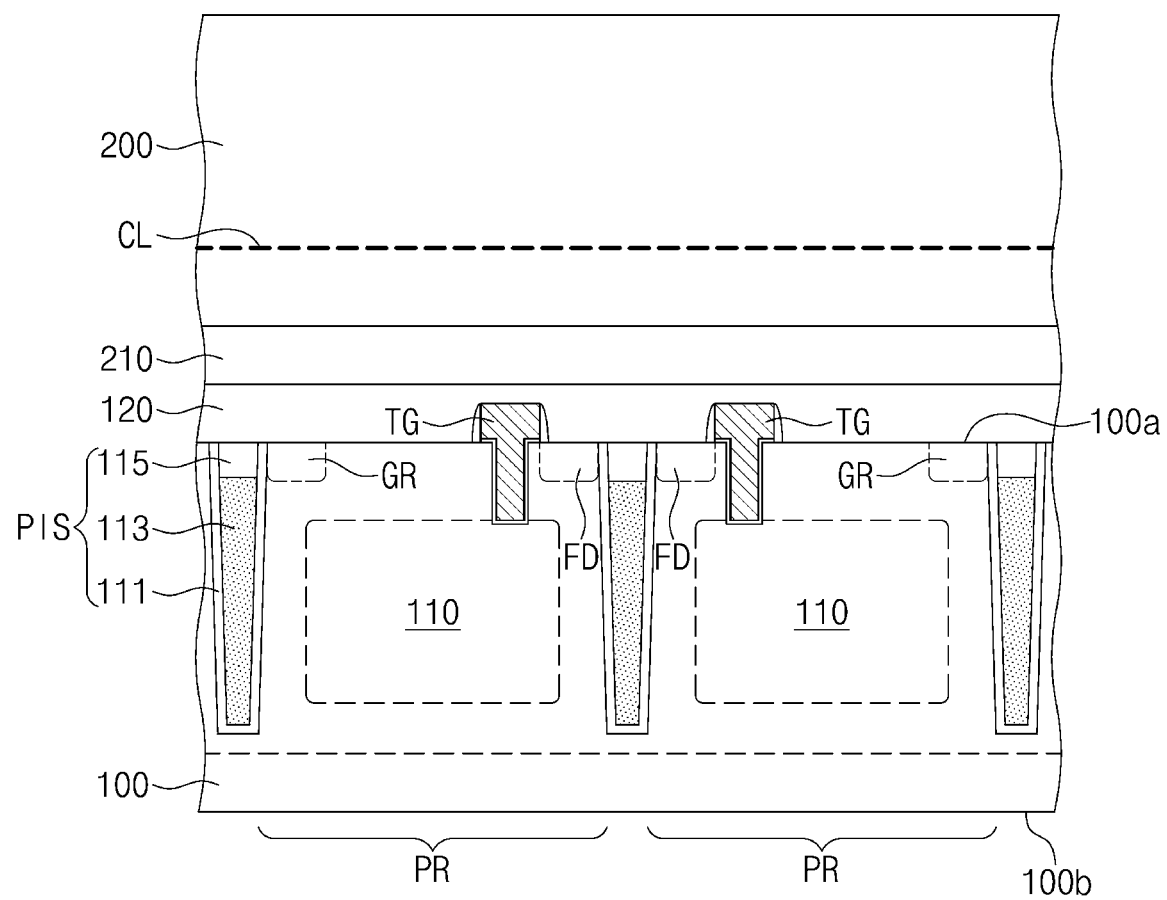

Referring to FIG. 21, the second semiconductor substrate 200 in which the separation layer CL is formed may be bonded to the first semiconductor substrate 100 in which the photoelectric conversion regions 110 and the transfer gate electrodes TG are formed.

For example, the top surface of the first dielectric layer 120 included in the first semiconductor substrate 100 may be bonded to that of the second dielectric layer 210 included in the second semiconductor substrate 200. Before the first and second semiconductor substrates 100 and 200 are bonded to each other, a surface plasma treatment may be performed to allow the first and second dielectric layers 120 and 210 to bond to each other. In addition, the first and second dielectric layers 120 and 210 may be in contact with each other at their top surfaces, and then one or both of heating and pressure processes may be performed.

Thereafter, an annealing process may be performed such that the second semiconductor substrate 200 may be separated along the separation layer CL. A heating treatment may cause hydrogen ions to escape from the separation layer CL, and thus the semiconductor substrate 200 may be separated into upper and lower segments along the separation layer CL.

Figure 22:
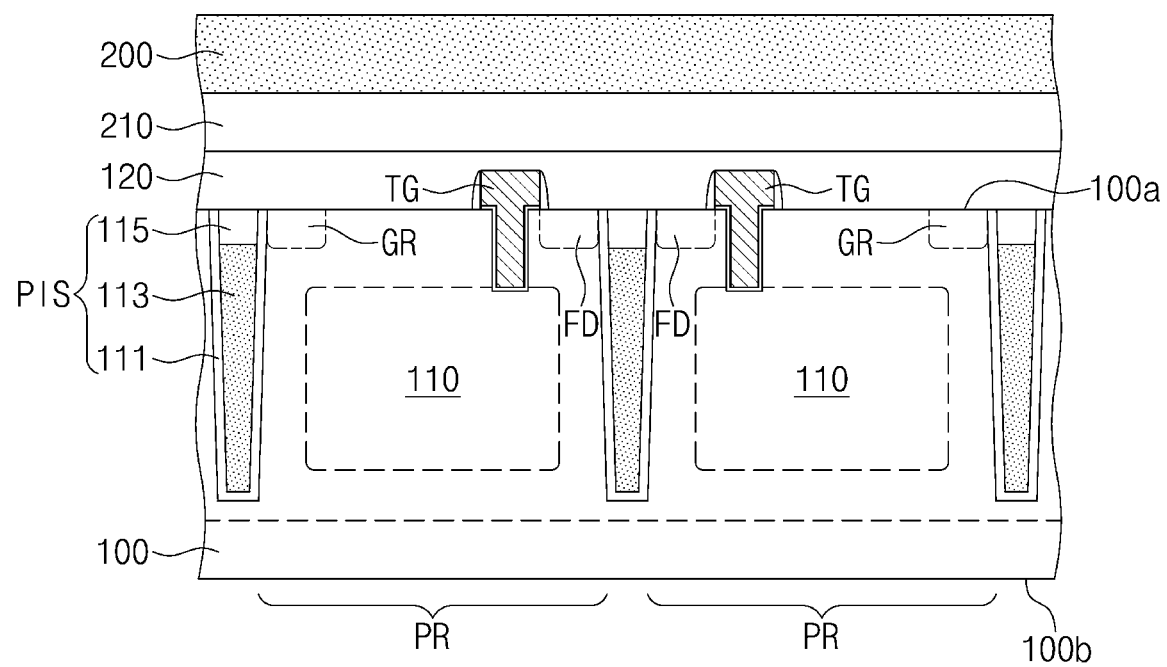

Referring to FIG. 22, an upper portion of the second semiconductor substrate 200 may remain on the second dielectric layer 210. A polishing process may be performed on a surface of the second semiconductor substrate 200 that remains on the second dielectric layer 210. The polishing process may include chemical mechanical polishing, dry etching, or wet etching.

Figure 23:
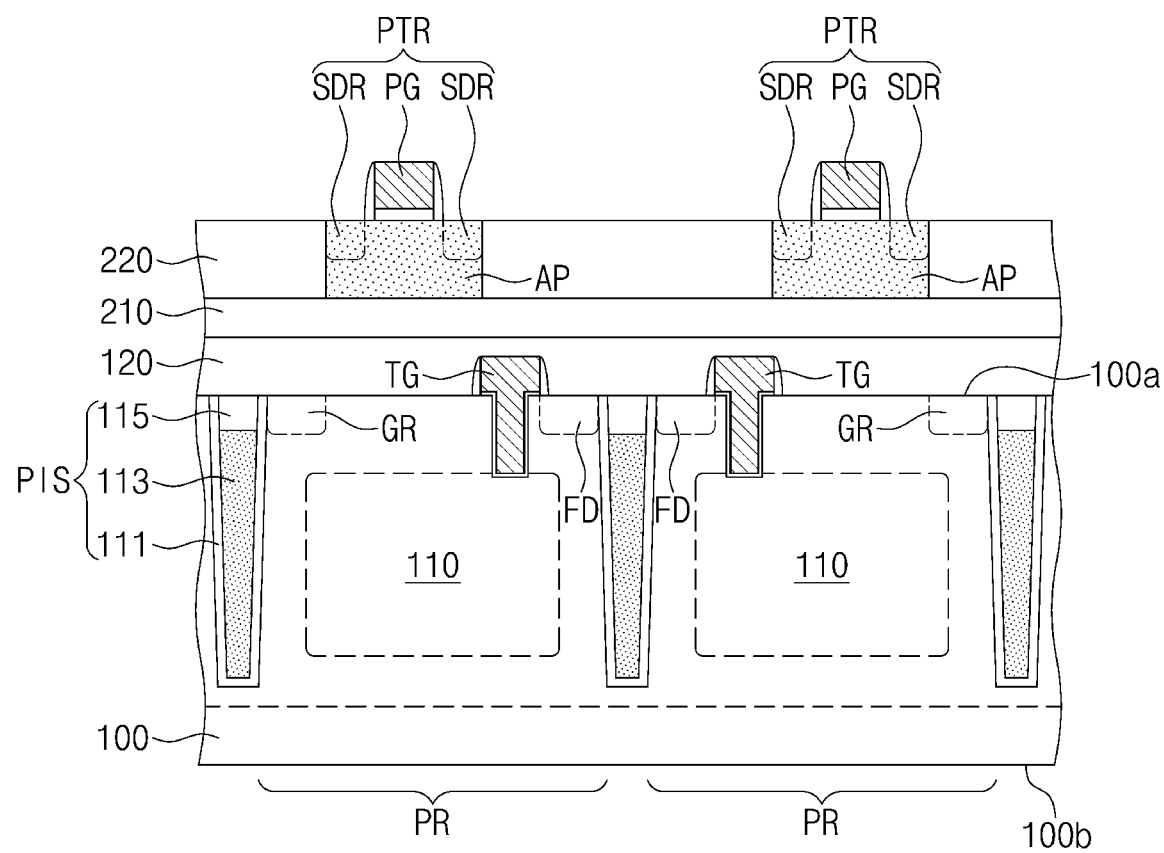

Referring to FIG. 23, the second semiconductor substrate 200 may be patterned to form active patterns AP that are disposed spaced apart from each other on the second dielectric layer 210. The active patterns AP may correspond to portions of the second semiconductor substrate 200 and may be formed of single-crystalline silicon. In a plan view, the active patterns AP may overlap portions of the photoelectric conversion regions 110 and a portion of the pixel isolation structure PIS. The active patterns AP may have a rectangular shape, a bar shape, a fin shape, or a pillar shape.

After the active patterns AP are formed, a buried dielectric layer 220 may be formed on the second dielectric layer 210 to fill a space between the active patterns AP. The buried dielectric layer 220 may include a silicon oxide layer, a silicon nitride layer, and/or a silicon oxynitride layer. The formation of the buried dielectric layer 220 may include depositing a dielectric layer to cover the active patterns AP, and then performing a planarization process to expose top surfaces of the active patterns AP.

After the buried dielectric layer 220 is formed, pixel gate electrodes PG may be formed on the active patterns AP with a gate dielectric layer interposed between the pixel gate electrodes PG and the active patterns AP. After the pixel gate electrodes PG are formed, source/drain regions SDR may be formed in the active pattern AP on opposite sides of each pixel gate electrode PG. A pixel transistor PTR may be constituted by each of the pixel gate electrodes PG and the source/drain regions SDR on opposite sides of each pixel gate electrode PG.

As discussed above, the pixel gate electrodes PG may each be formed to completely surround the active pattern AP or to surround three surfaces of the active pattern AP. The pixel grate electrodes PG may include a refractory metal layer including cobalt, titanium, nickel, tungsten, and/or molybdenum and/or a metal nitride layer such as a titanium nitride (TiN) layer, a titanium silicon nitride (TiSiN) layer, a titanium aluminum nitride (TiAlN) layer, a tantalum nitride (TaN) layer, tantalum silicon nitride (TaSiN) layer, tantalum aluminum nitride (TaAlN) layer, and/or a tungsten nitride (WN) layer.

Figure 24:
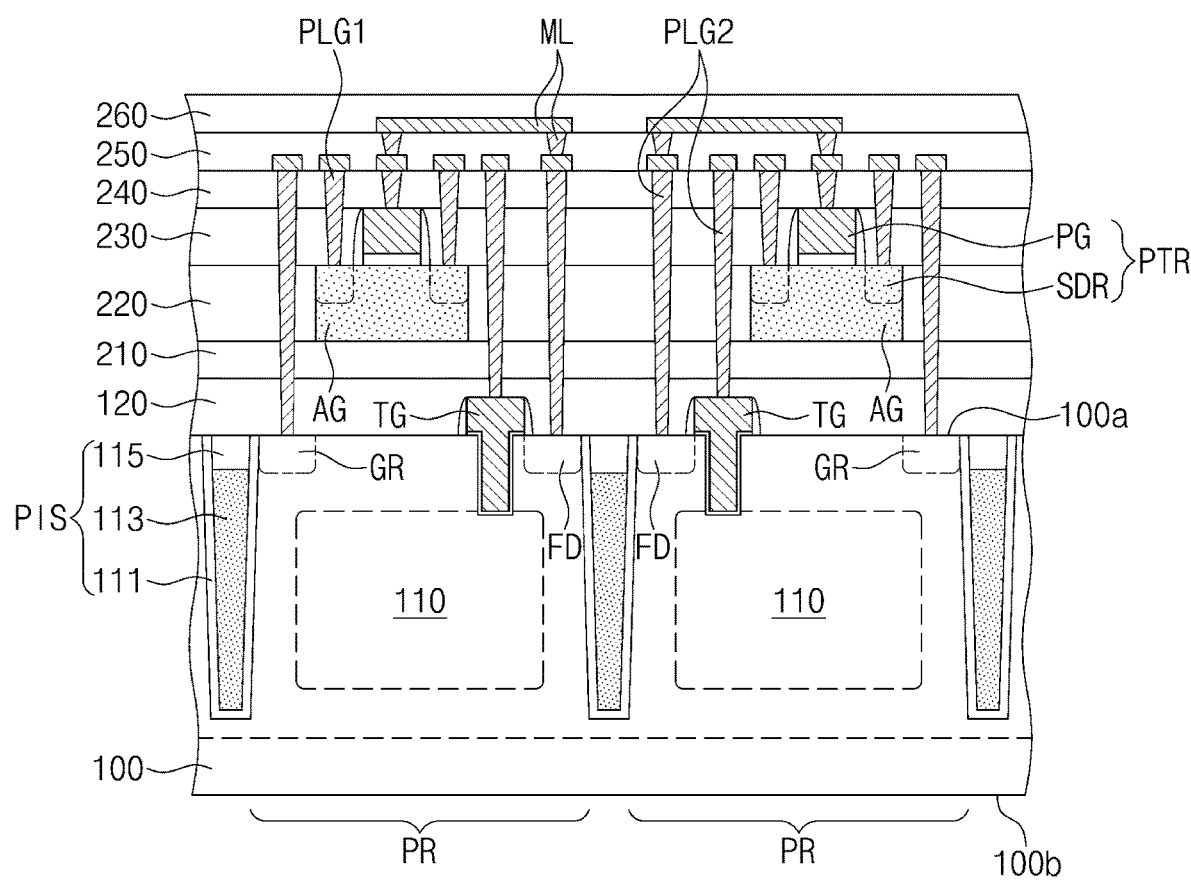

Referring to FIG. 24, interlayer dielectric layers 230, 240, 250, and 260 may be formed on the buried dielectric layer 220 to cover the pixel transistors PTR. In addition, first and second contact plugs PLG1 and PLG2 and conductive lines ML may be formed for connection of the transfer gate electrodes TG and the floating diffusion region FD in the first semiconductor substrate 100 and for connection of the pixel transistors PTR on the active patterns AP.

The first and second contact plugs PLG1 and PLG2 may have different lengths from each other, and may have their top surfaces located at substantially the same level.

The conductive lines ML may be formed between the interlayer dielectric layers 230, 240, 250, and 260. The conductive lines ML for electrical connection of the pixel transistors PTR may be disposed without position limitation. The first and second contact plugs PLG1 and PLG2 and the conductive lines ML may be formed of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or any alloy thereof.

Figure 25:
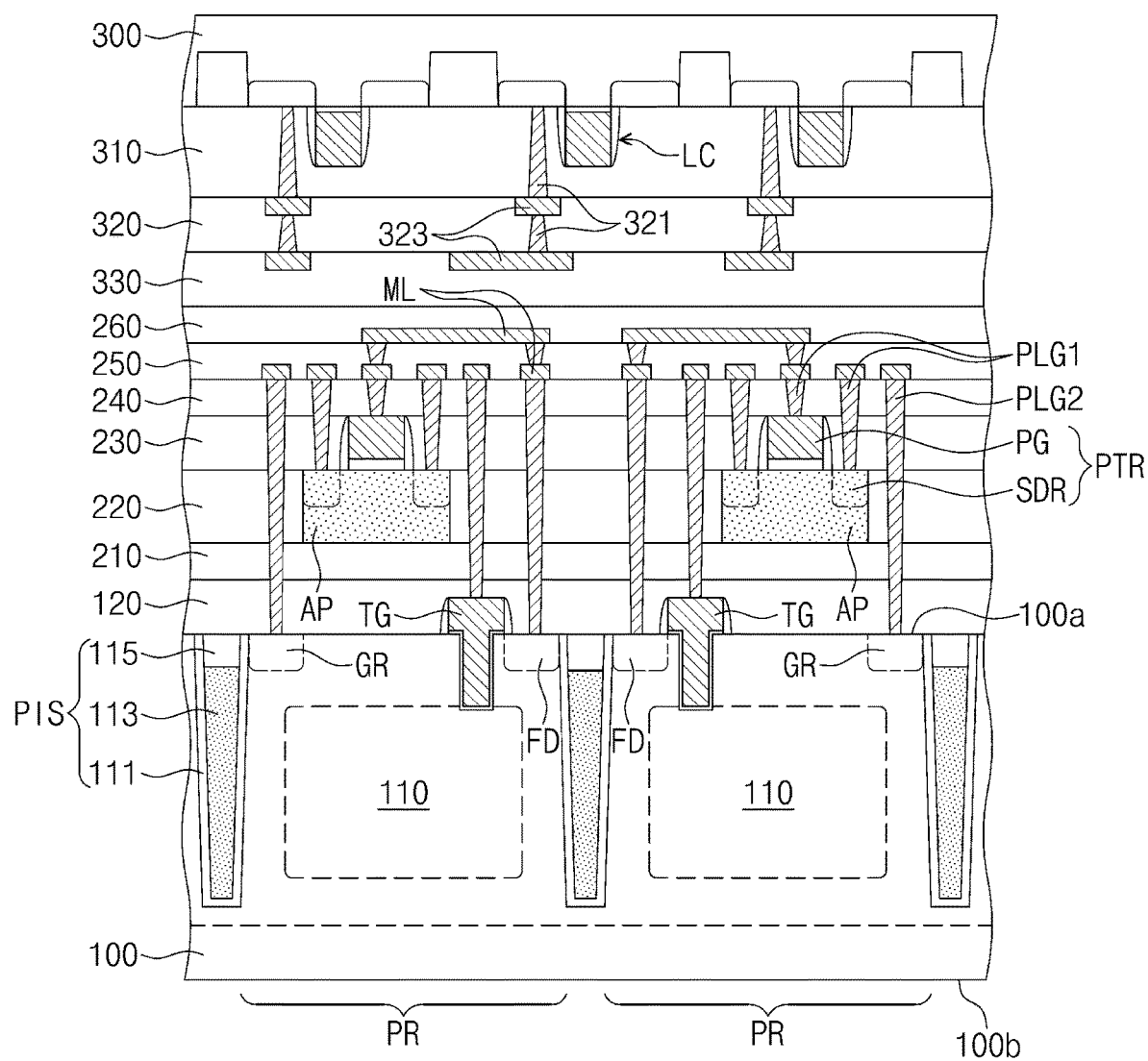

Referring to FIG. 25, a logic circuit layer 2A may be bonded to an uppermost interlayer dielectric layer 260.

The logic circuit layer 2A may include a logic semiconductor substrate 300, logic circuits LC, logic contact plugs 321 connected to the logic circuits LC, logic conductive lines 323, and logic interlayer dielectric layers 310, 320, and 330. An uppermost logic interlayer dielectric layer 330 of the logic circuit layer 2A may be bonded to the uppermost interlayer dielectric layer 260 on the first surface 100a of the first semiconductor substrate 100.

Figure 26:
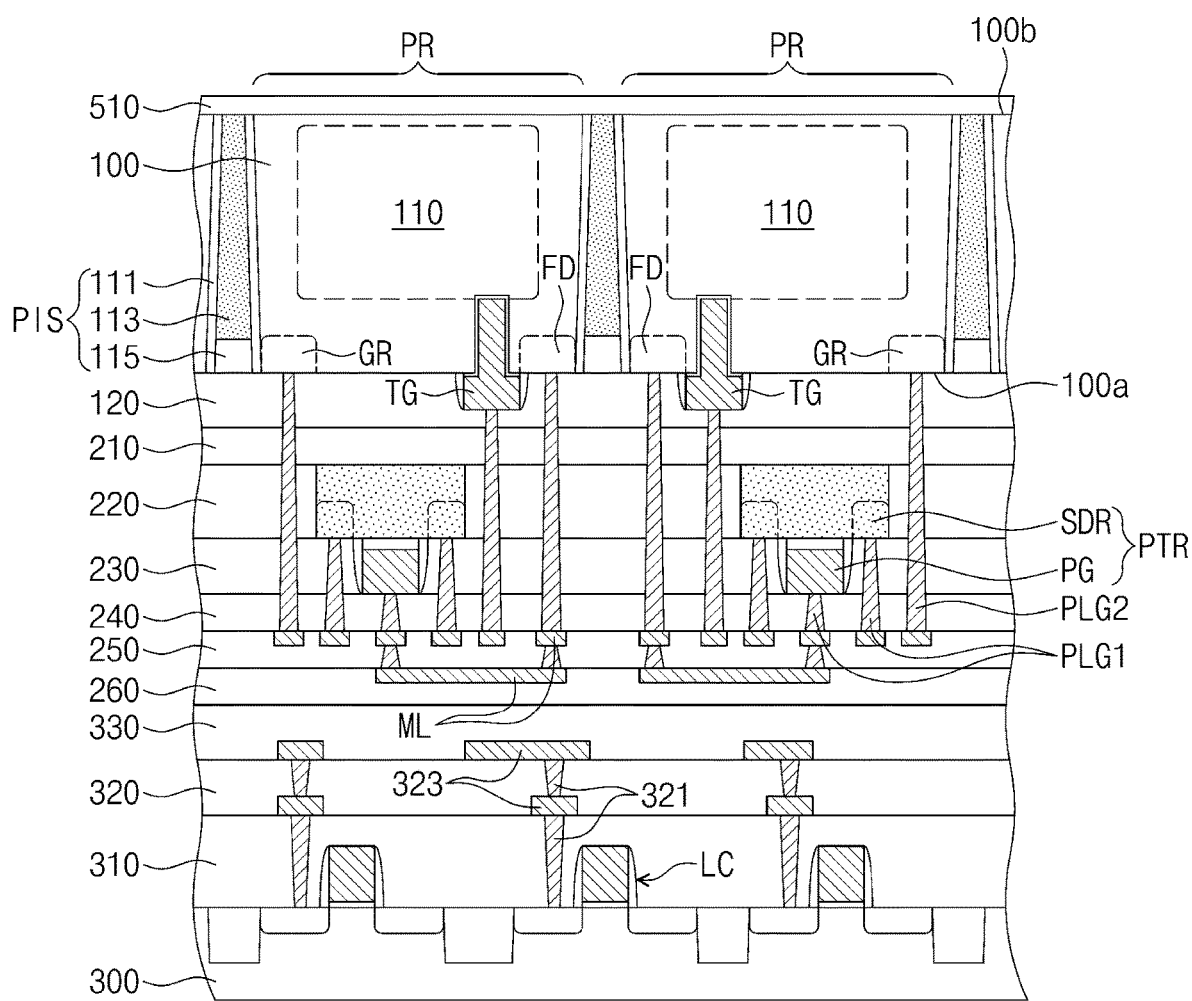

Referring to FIG. 26, after the logic circuit layer 2A is bonded, a thinning process may be performed to remove a portion of the first semiconductor substrate 100 to reduce a vertical thickness of the first semiconductor substrate 100. The thinning process may include grinding or polishing the second surface 100b of the first semiconductor substrate 100, and anisotropically or isotropically etching the second surface 100b of the first semiconductor substrate 100. The first semiconductor substrate 100 may be turned upside down to thin the first semiconductor substrate 100. A grinding or polishing process may be performed to remove a bulk silicon substrate of the first semiconductor substrate 100 and to expose an epitaxial layer of the first semiconductor substrate 100. After that, an anisotropic or isotropic etching process may be performed to remove surfaces defects present on an exposed surface of the epitaxial layer.

The thinning process performed on the first semiconductor substrate 100 may expose the semiconductor pattern 113 of the pixel isolation structure PIS on the second surface 100b of the first semiconductor substrate 100. A surface of the semiconductor pattern 113 and a surface of the liner dielectric pattern 111 may be located at substantially the same level as that of the second surface 100b of the first semiconductor substrate 100.

Afterwards, a planarized dielectric layer 510 may be formed on the second surface 100b of the first semiconductor substrate 100. The planarized dielectric layer 510 may cover the surface of the semiconductor pattern 113 and the second surface 100b of the first semiconductor substrate 100. The planarized dielectric layer 510 may be formed by depositing metal oxide, such as aluminum oxide and/or hafnium oxide.

Thereafter, as shown in FIGS. 4A and 4B, a grid structure 520, color filters 540, and micro-lenses 550 may be formed on the planarized dielectric layer 510.

According to some embodiments of the present inventive concepts, a second semiconductor substrate may be bonded to a first semiconductor substrate in which photoelectric conversions regions are formed, and thereafter the second semiconductor substrate may be disposed thereon with pixel transistors disposed on each of pixel regions. Therefore, an image sensor may be made more highly integrated, and performance of the pixel transistors may be securely obtained even when a unit pixel decreases in size.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. An image sensor, comprising:
a pixel isolation structure disposed on a semiconductor substrate, the pixel isolation structure defining a plurality of pixel regions;
a photoelectric conversion region of the semiconductor substrate disposed on each of the plurality of pixel regions;
a floating diffusion region, of the semiconductor substrate, spaced apart from the photoelectric conversion region;
a transfer gate electrode disposed between the photoelectric conversion region and the floating diffusion region on each of the plurality of pixel regions;
a dielectric layer disposed on the semiconductor substrate and covering the transfer gate electrode;
a plurality of active patterns, spaced apart from each other, disposed on a top surface of the dielectric layer; and
a plurality of pixel transistors disposed on corresponding active patterns of the plurality of active patterns,
wherein at least one of the plurality of active patterns overlaps the photoelectric conversion region.

2. The image sensor of claim 1, wherein the transfer gate electrode vertically penetrates a portion of the semiconductor substrate and has a bottom surface that is at a level lower than a top surface of the semiconductor substrate.

3. The image sensor of claim 1, wherein
the floating diffusion region is vertically spaced apart from and overlaps the photoelectric conversion region, and
the transfer gate electrode has a ring shape that surrounds the floating diffusion region.

4. The image sensor of claim 1, wherein each of the plurality of pixel transistors includes:
a pixel gate electrode that runs across the plurality of active patterns; and
a plurality of source/drain regions in the plurality of active pattern on opposite sides of the pixel gate electrode.

5. The image sensor of claim 1, wherein each of the plurality of active patterns includes:
a horizontal part on the dielectric layer; and
a pillar part that protrudes from the horizontal part in a vertical direction to a top surface of the semiconductor substrate,
wherein each of the plurality of pixel transistors includes:
a pixel gate electrode that surrounds a portion of the pillar part of an active pattern of the plurality of active patterns; and
a plurality of source/drain regions in the plurality of active patterns that are spaced apart from each other in the vertical direction.

6. The image sensor of claim 1, wherein each of the plurality of pixel transistors includes:
a pixel gate electrode that surrounds opposite sidewalls and a top surface of each of the plurality of active patterns; and
a plurality of source/drain regions in the plurality of active patterns on opposite sides of the pixel gate electrode.

7. The image sensor of claim 1, wherein
the plurality of pixel regions include first, second, third, and fourth pixel regions, and
the floating diffusion region is in common between the photoelectric conversion regions of the first, second, third, and fourth pixel regions.

8. The image sensor of claim 7, wherein the pixel isolation structure includes:
a plurality of first parts that extend in a first direction and are spaced apart from each other; and
a plurality of second parts that extend in a second direction and are spaced apart from each other, the second direction intersecting the first direction,
wherein at least one of the plurality of first parts and at least one of the plurality of second parts are spaced apart from the floating diffusion region.

9. The image sensor of claim 1, wherein
the plurality of active patterns are spaced apart from each other on the dielectric layer, and
the image sensor further comprises a buried dielectric layer between neighboring active patterns of the plurality of active patterns.

10. The image sensor of claim 1, further comprising:
a plurality of first contact plugs coupled to the plurality of pixel transistors; and
a plurality of second contact plugs spaced apart from the plurality of active patterns and penetrating the dielectric layer, the second contact plugs being coupled to the transfer gate electrode and the floating diffusion region.

11. The image sensor of claim 1, wherein the plurality of pixel transistors include a reset transistor, a dual conversion gain transistor, a source follower transistor, and a selection transistor.

12. The image sensor of claim 1, wherein the dielectric layer includes:
a first dielectric layer that covers the transfer gate electrode; and
a second dielectric layer disposed between an active pattern of the plurality of active patterns and the first dielectric layer, the second dielectric layer being coupled to the first dielectric layer.

13. An image sensor, comprising:
a photoelectric conversion circuit layer that includes a pixel isolation structure in a first semiconductor substrate and defining a pixel region, a photoelectric conversion region disposed on the pixel region, a floating diffusion region in the first semiconductor substrate and spaced apart from the photoelectric conversion region, and a transfer gate electrode disposed on the first semiconductor substrate between the photoelectric conversion region and the floating diffusion region;
a pixel circuit layer that includes a plurality of active patterns disposed on a dielectric layer and a plurality of pixel transistor disposed on the active patterns, at least one of the plurality of active patterns overlapping the photoelectric conversion region, respectively, and at least one of the pixel transistor being connected to the floating diffusion region; and
a logic circuit layer that includes a plurality of logic circuits disposed on a second semiconductor substrate and connected to the pixel transistor,
wherein a bottom surface of the pixel circuit layer is bonded to a top surface of the photoelectric conversion circuit layer, and
wherein a top surface of the pixel circuit layer is bonded to a top surface of the logic circuit layer.

14. The image sensor of claim 13, wherein, the dielectric layer is disposed between the active patterns and the transfer gate electrode.

15. The image sensor of claim 13, wherein the photoelectric conversion circuit layer further includes a first dielectric layer disposed on the first semiconductor substrate and bonded to the dielectric layer of the pixel circuit layer, the first dielectric layer covering the transfer gate electrode.

16. The image sensor of claim 13, further comprising a through via that penetrates the first or second semiconductor substrate and connects the logic circuit layer to the pixel circuit layer.

17. The image sensor of claim 13, wherein
the pixel circuit layer further includes a plurality of first bonding pads connected to the pixel transistors,
the logic circuit layer further includes a plurality of second bonding pads connected to the logic circuits, and
the plurality of first bonding pads are in contact with the plurality of second bonding pads.

18. The image sensor of claim 13, wherein the pixel transistors includes a reset transistor, a dual conversion gain transistor, a source follower transistor, and/or a selection transistor.

19. The image sensor of claim 13, further comprising:
a plurality of first contact plugs coupled to the pixel transistors; and
a plurality of second contact plugs spaced apart from the active patterns, the plurality of second contact plugs penetrating the dielectric layer and being coupled to the transfer gate electrode and the floating diffusion region.

* * * * *